US009711658B2

(12) United States Patent
Masuoka et al.

(10) Patent No.: US 9,711,658 B2
(45) Date of Patent: *Jul. 18, 2017

(54) SEMICONDUCTOR DEVICE

(71) Applicant: Unisantis Electronics Singapore Pte. Ltd., Singapore (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 15/342,496

(22) Filed: Nov. 3, 2016

(65) Prior Publication Data
US 2017/0077315 A1    Mar. 16, 2017

Related U.S. Application Data

(63) Continuation of application No. 15/171,433, filed on Jun. 2, 2016, now Pat. No. 9,530,793, which is a
(Continued)

(51) Int. Cl.
*H01L 23/52* (2006.01)
*H01L 29/792* (2006.01)
(Continued)

(52) U.S. Cl.
CPC ........ *H01L 29/7926* (2013.01); *H01L 23/528* (2013.01); *H01L 23/5226* (2013.01);
(Continued)

(58) Field of Classification Search
CPC ............ H01L 29/7926; H01L 23/5226; H01L 27/11524; H01L 27/1157; H01L 29/42332;
(Continued)

(56) References Cited

U.S. PATENT DOCUMENTS 5,801,398 A    9/1998  Hebiguchi
6,727,544 B2   4/2004  Endoh et al.
(Continued)

FOREIGN PATENT DOCUMENTS

JP    H08-116060 A    5/1996
JP    11-297984 A    10/1999
(Continued)

OTHER PUBLICATIONS

English language translation of International Preliminary Report on Patentability in corresponding International Application No. PCT/JP2014/055261, dated Sep. 15, 2016, 7 pages.
(Continued)

*Primary Examiner* — Nicholas Tobergte
(74) *Attorney, Agent, or Firm* — Brinks Gilson & Lione

(57) ABSTRACT

A semiconductor device includes a first pillar-shaped semiconductor layer, a first selection gate insulating film, a first selection gate, a first gate insulating film, a first contact electrode, a first bit line connected to an upper portion of the first pillar-shaped semiconductor layer and an upper portion of the first contact electrode, a second pillar-shaped semiconductor layer, a layer including a first charge storage layer, a first control gate, a layer including a second charge storage layer and formed above the first control gate, a second control gate, a second gate insulating film, a second contact electrode having an upper portion connected to an upper portion of the second pillar-shaped semiconductor layer, and a first lower internal line that connects a lower portion of the first pillar-shaped semiconductor layer and a lower portion of the second pillar-shaped semiconductor layer.

24 Claims, 45 Drawing Sheets

Related U.S. Application Data continuation of application No. PCT/JP2014/055261, filed on Mar. 3, 2014.

(51) Int. Cl.
    *H01L 29/66*      (2006.01)
    *H01L 27/11582*   (2017.01)
    *H01L 23/522*     (2006.01)
    *H01L 23/528*     (2006.01)
    *H01L 27/1157*    (2017.01)
    *H01L 27/11524*   (2017.01)
    *H01L 29/423*     (2006.01)
    *H01L 29/788*     (2006.01)

(52) U.S. Cl.
    CPC .... *H01L 27/1157* (2013.01); *H01L 27/11524* (2013.01); *H01L 27/11582* (2013.01); *H01L 29/42332* (2013.01); *H01L 29/42344* (2013.01); *H01L 29/66825* (2013.01); *H01L 29/66833* (2013.01); *H01L 29/7889* (2013.01)

(58) Field of Classification Search
    CPC ......... H01L 29/42344; H01L 29/66825; H01L 29/66833; H01L 29/7889
    See application file for complete search history.

(56) References Cited

U.S. PATENT DOCUMENTS

| | | | |
|---|---|---|---|
| 6,870,215 B2 | 3/2005 | Endoh et al. | |
| 6,891,234 B1 | 5/2005 | Connelly et al. | |
| 6,933,556 B2 | 8/2005 | Endoh et al. | |
| 7,135,726 B2 | 11/2006 | Endoh et al. | |
| 7,936,004 B2 | 5/2011 | Kito et al. | |
| 8,212,298 B2 | 7/2012 | Masuoka et al. | |
| 8,258,571 B2 | 9/2012 | Endoh et al. | |
| 8,541,832 B2 | 9/2013 | Kim et al. | |
| 8,563,379 B2 | 10/2013 | Masuoka et al. | |
| 8,575,686 B2 | 11/2013 | Masuoka et al. | |
| 8,648,404 B2 | 2/2014 | Ko et al. | |
| 8,952,441 B2 | 2/2015 | Sakuma et al. | |
| 9,337,319 B2 | 5/2016 | Masuoka et al. | |
| 9,530,793 B2 * | 12/2016 | Masuoka | H01L 29/66833 |
| 2004/0262681 A1 | 12/2004 | Masuoka et al. | |
| 2009/0065860 A1 | 3/2009 | Mikasa | |
| 2009/0283804 A1 | 11/2009 | Masuoka et al. | |

FOREIGN PATENT DOCUMENTS

| | | |
|---|---|---|
| JP | 2003-078044 A | 3/2003 |
| JP | 2004-356314 A | 12/2004 |
| JP | 2007-266143 A | 10/2007 |
| JP | 2008-159612 A | 7/2008 |
| JP | 2009-027134 A | 2/2009 |
| JP | 2009-070975 A | 4/2009 |
| JP | WO 2009/096468 A1 | 8/2009 |
| JP | 2011-029586 A | 2/2011 |
| JP | 2011-040682 A | 2/2011 |
| JP | 2013-004690 A | 1/2013 |
| JP | 2013-239622 A | 11/2013 |
| JP | WO 2014/024266 A1 | 2/2014 |

OTHER PUBLICATIONS

Notice of Allowance in corresponding U.S. Appl. No. 15/171,433, dated Oct. 5, 2016, 8 pages.

* cited by examiner

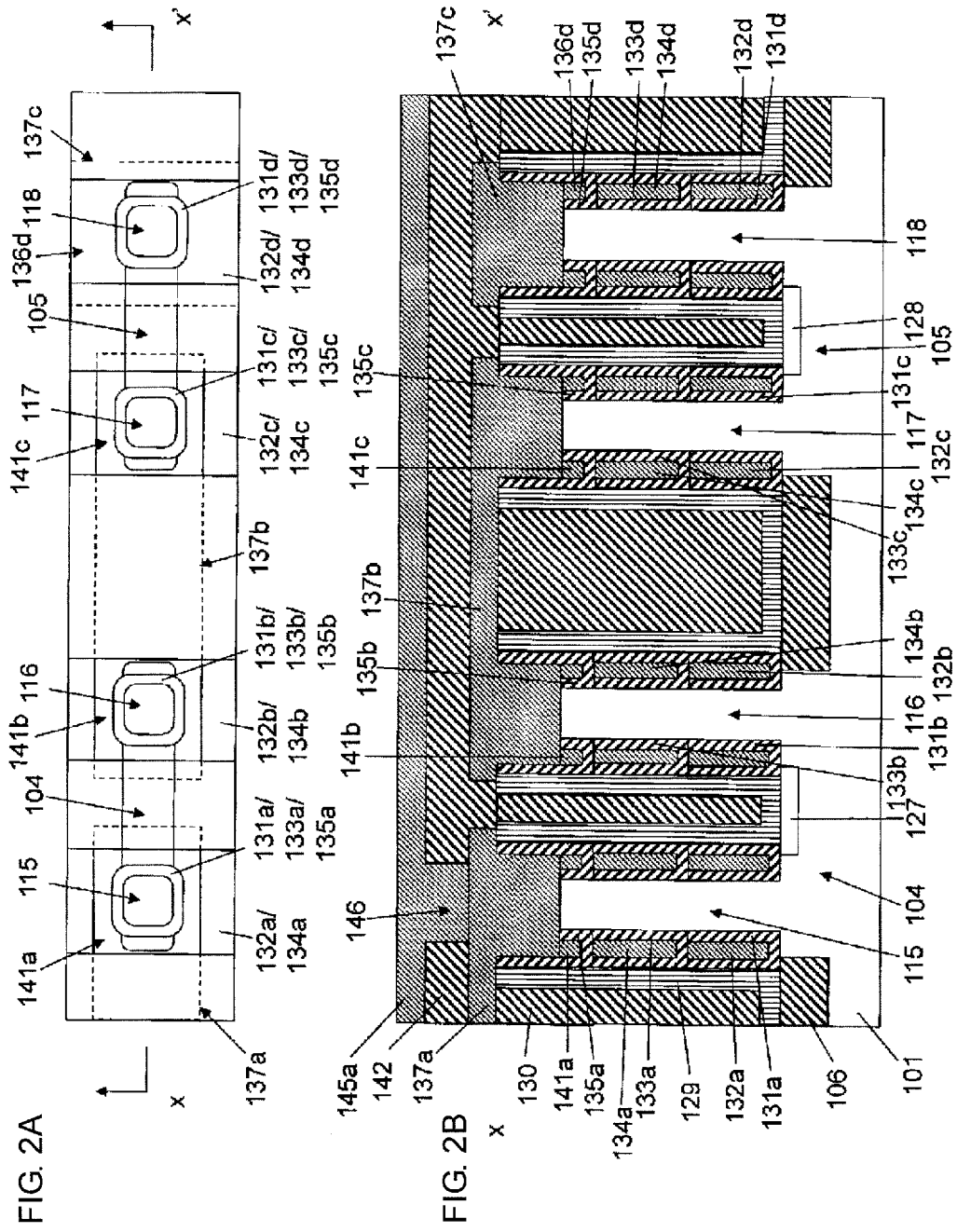

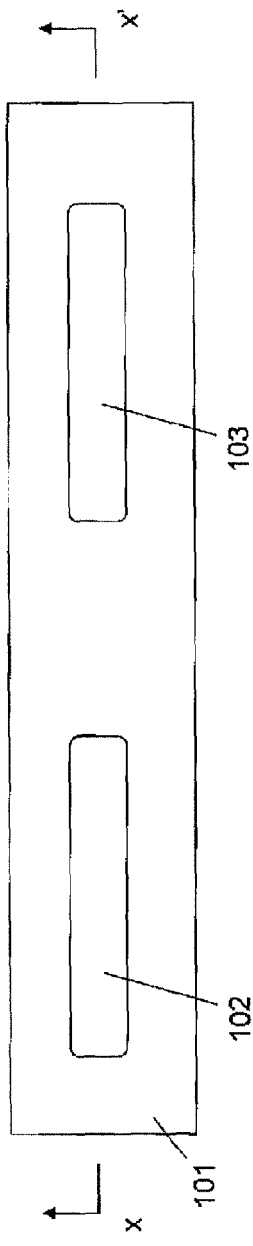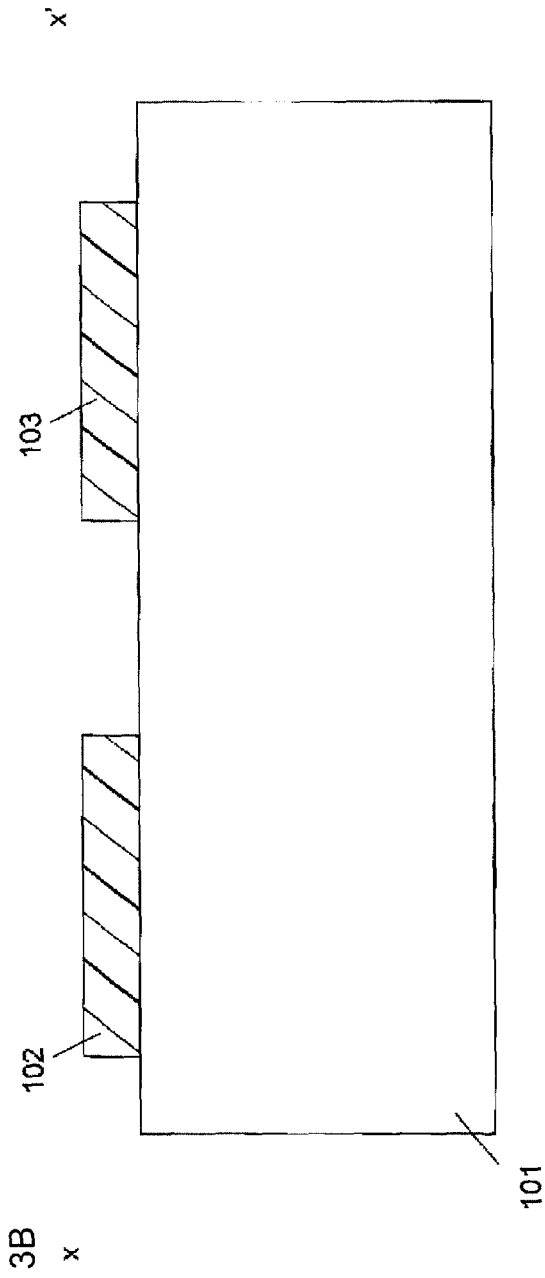
FIG. 3A
FIG. 3B

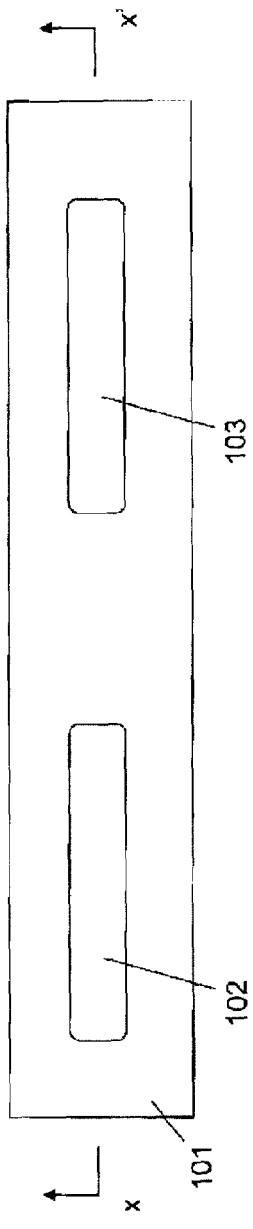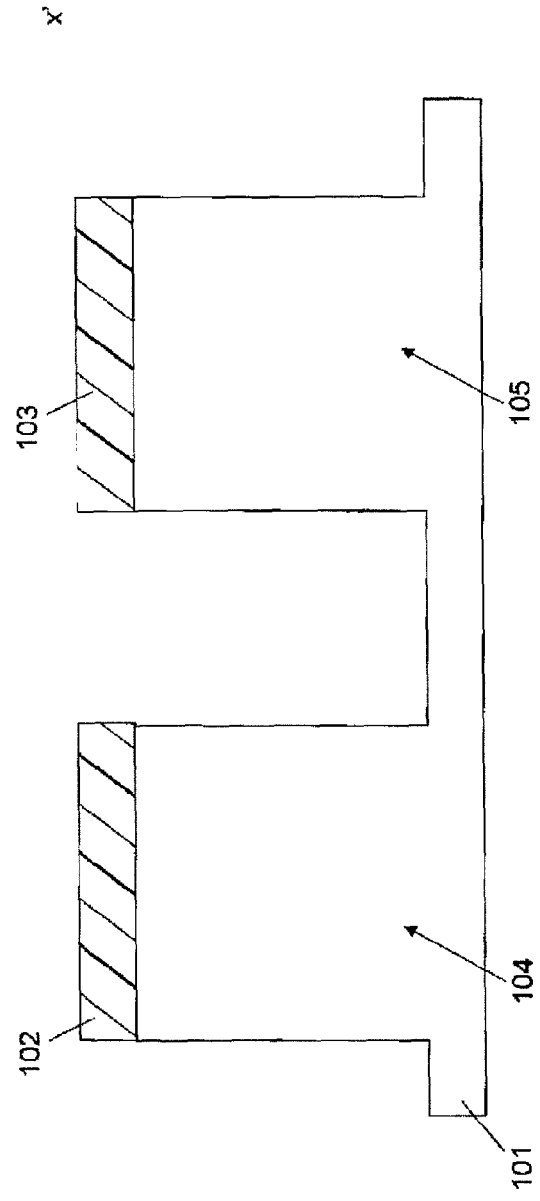
FIG. 4A
FIG. 4B

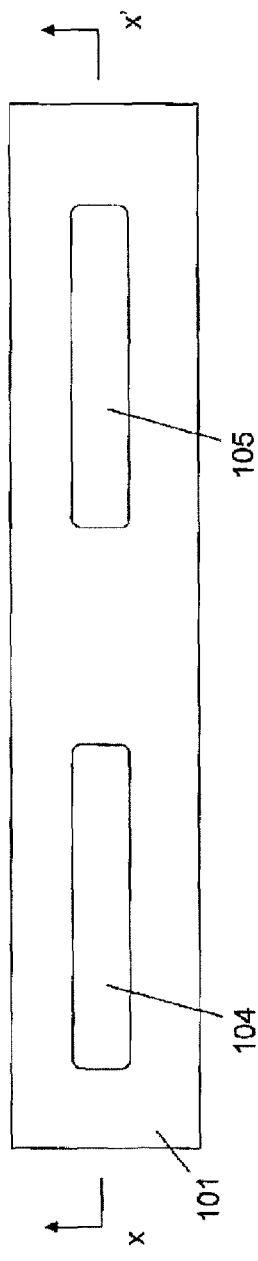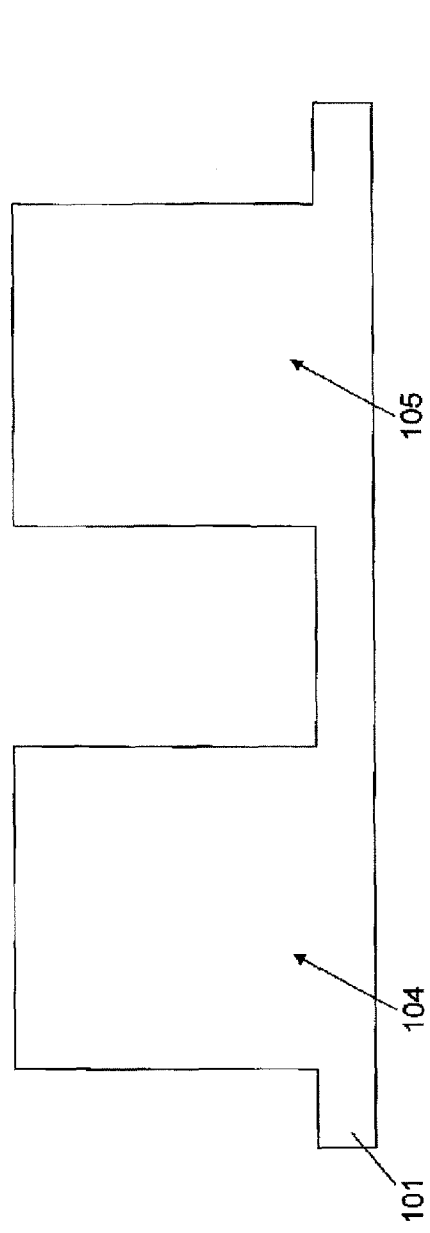
FIG. 5A
FIG. 5B

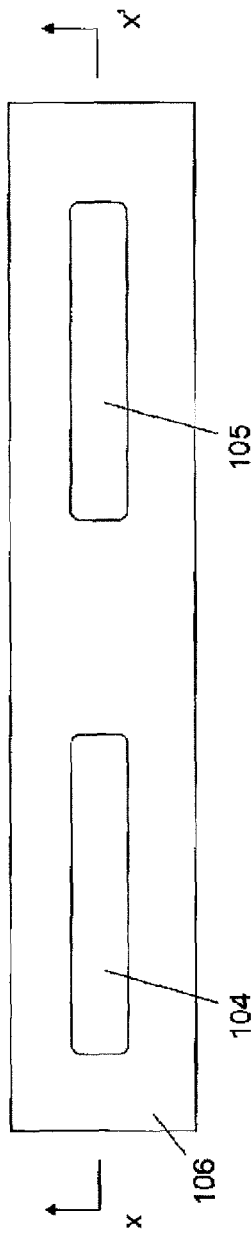
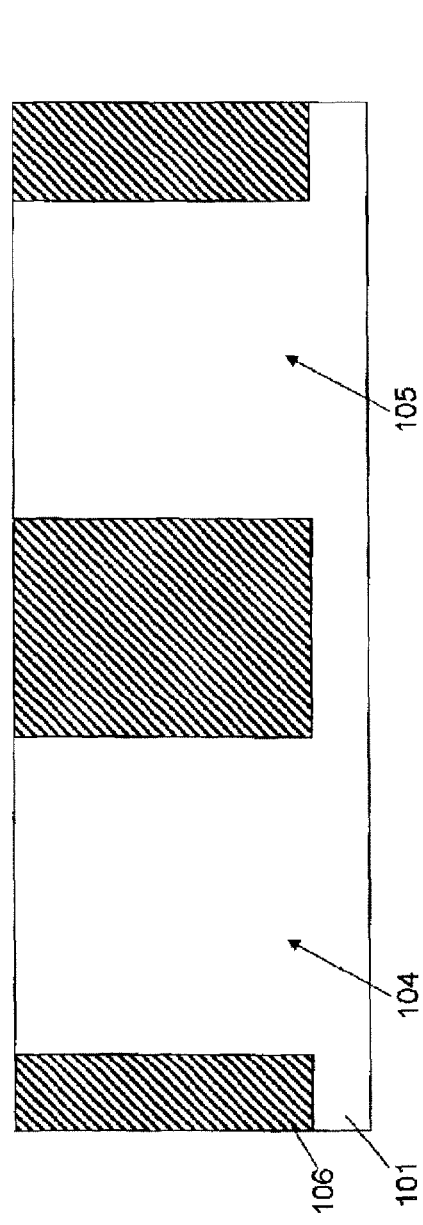
FIG. 6A
FIG. 6B

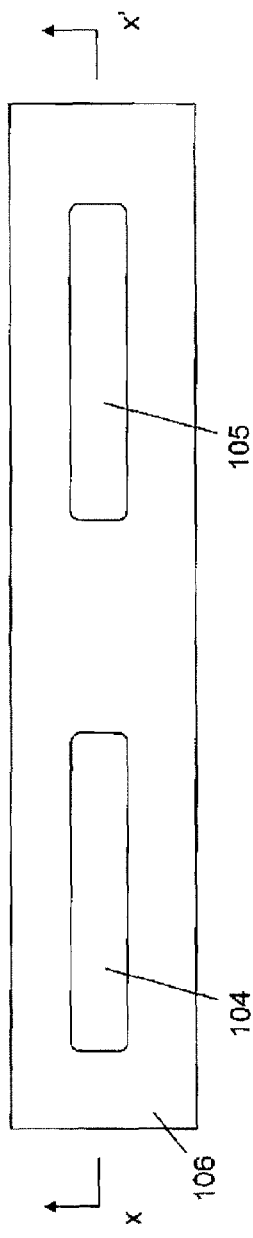
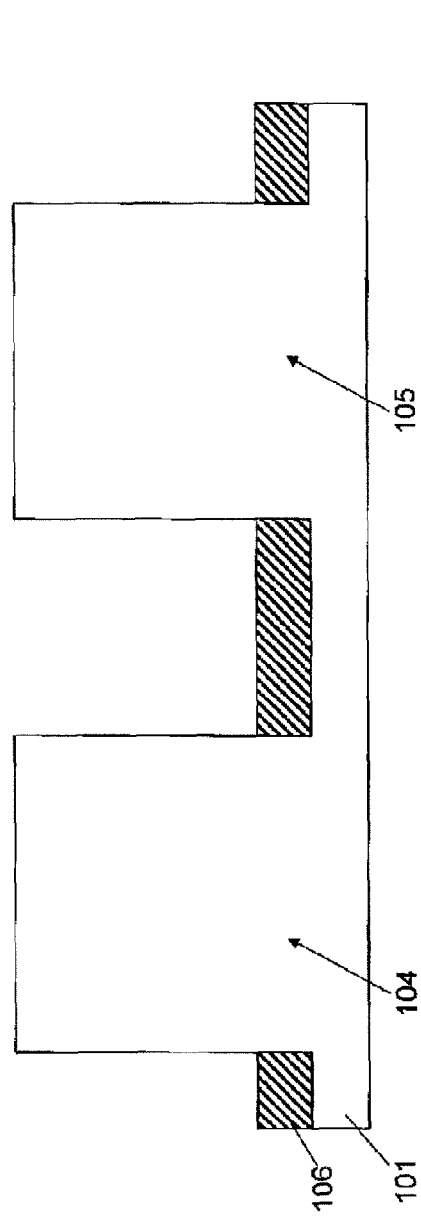
FIG. 7A
FIG. 7B

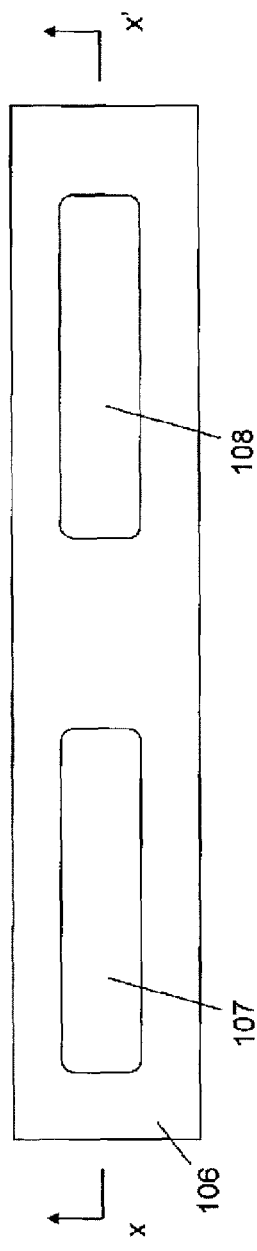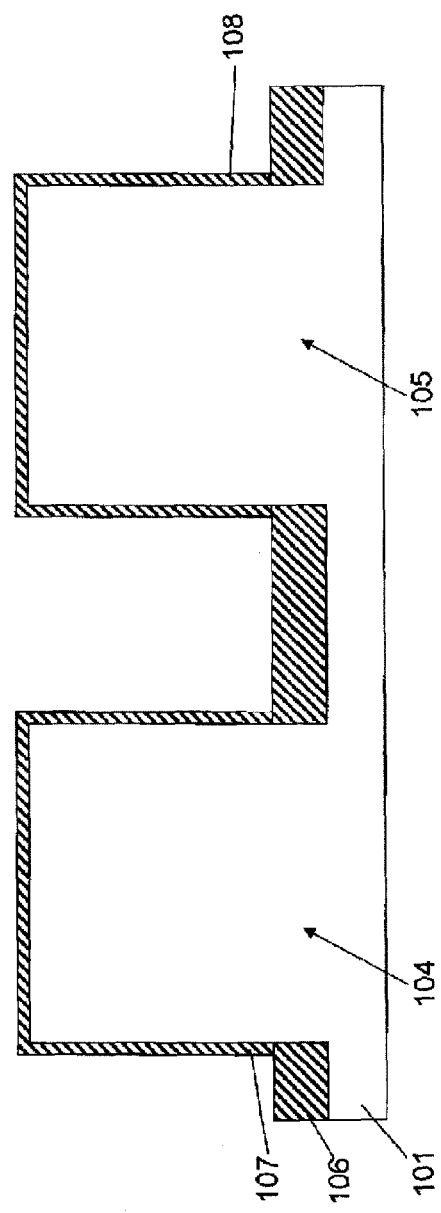
FIG. 8A
FIG. 8B

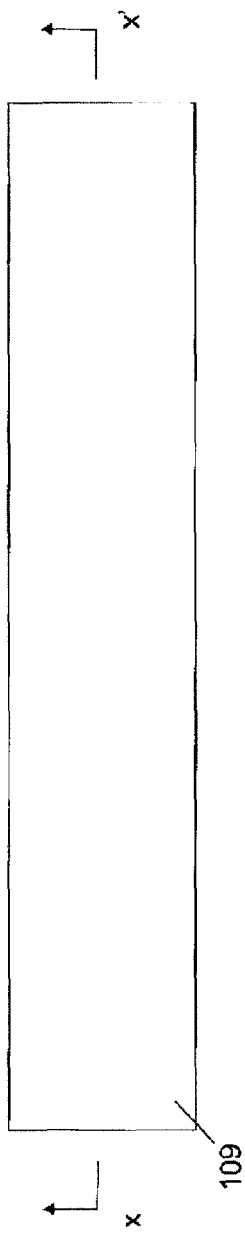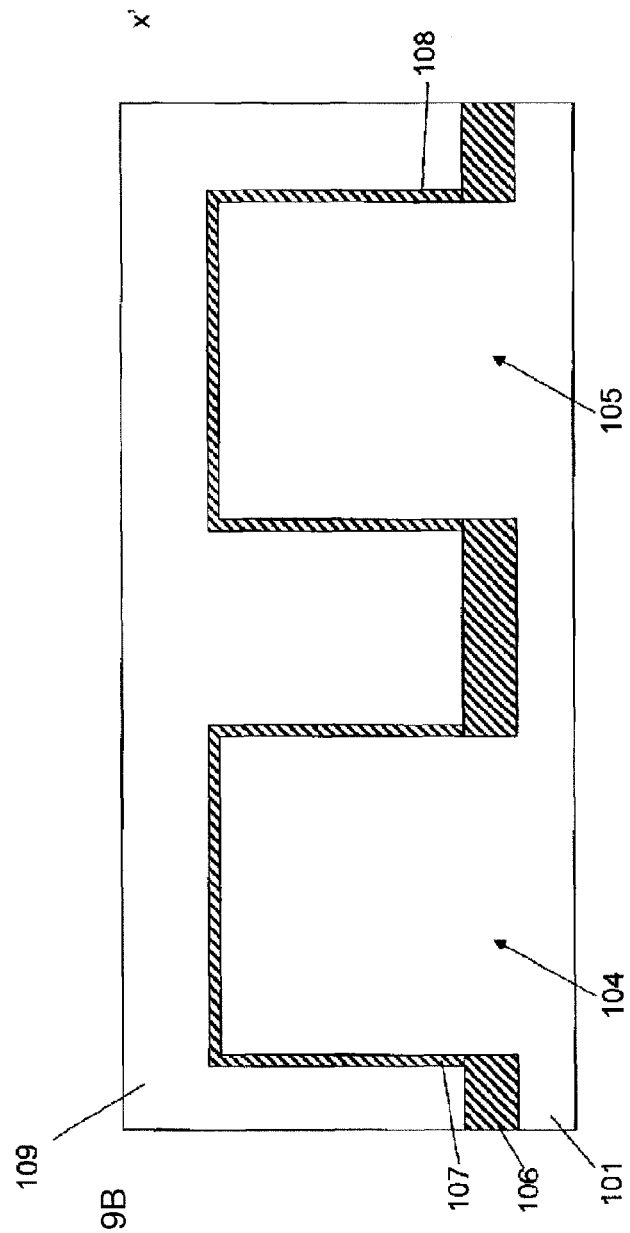
FIG. 9A
FIG. 9B

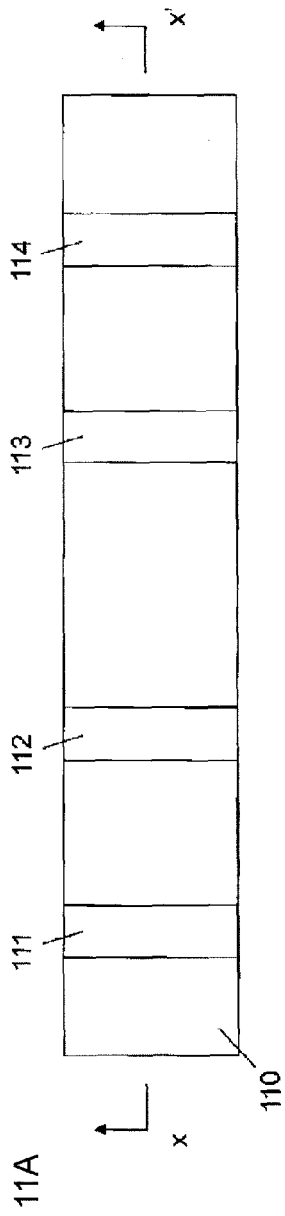
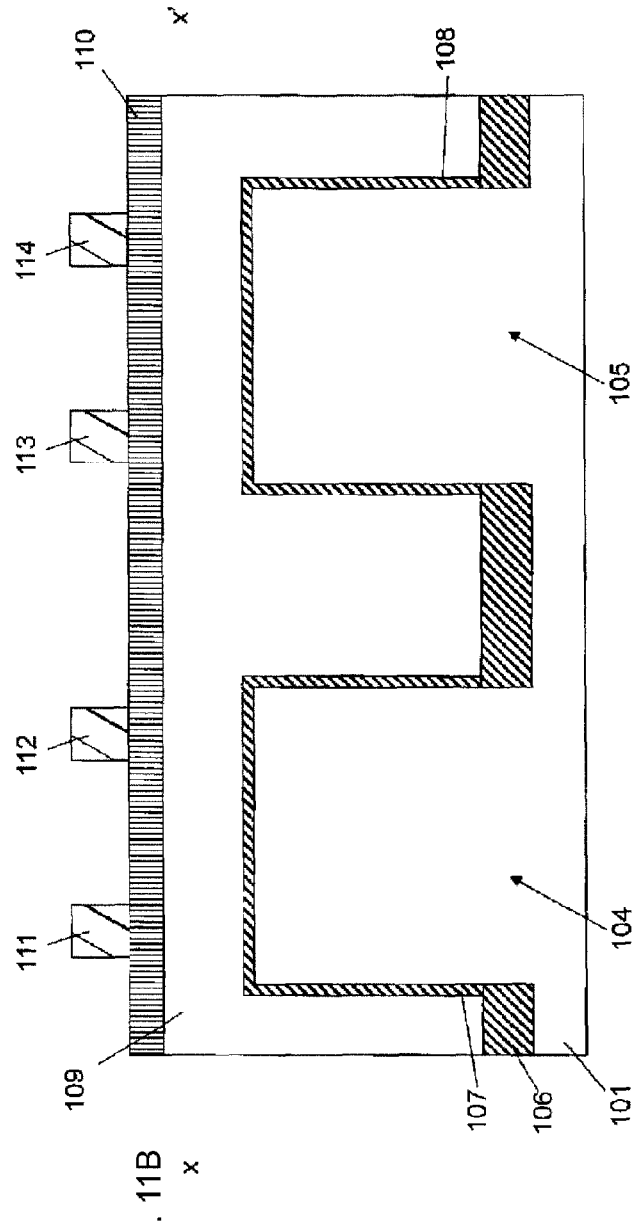
FIG. 11A
FIG. 11B

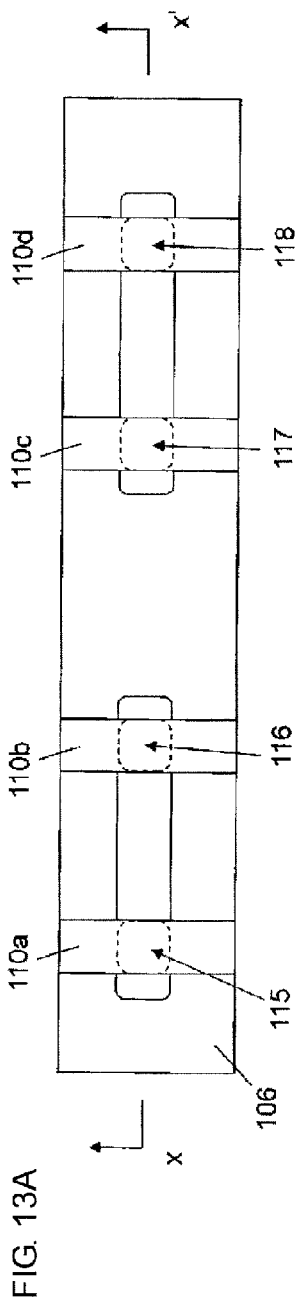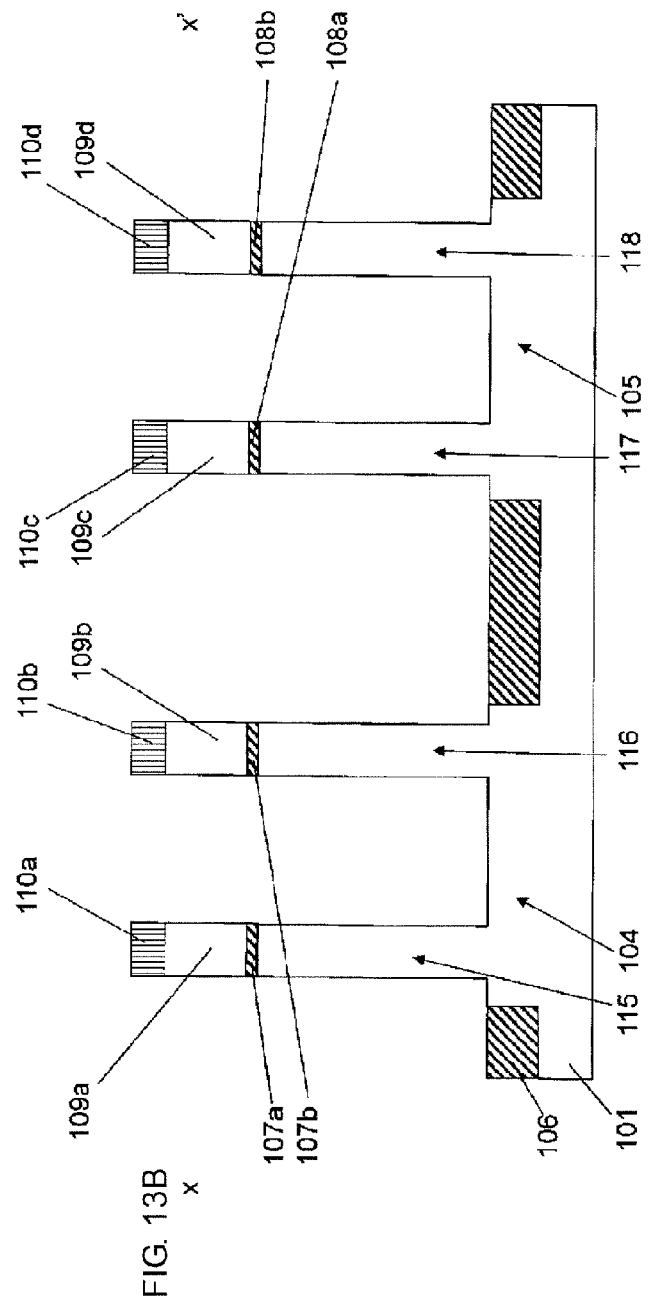
FIG. 13A
FIG. 13B

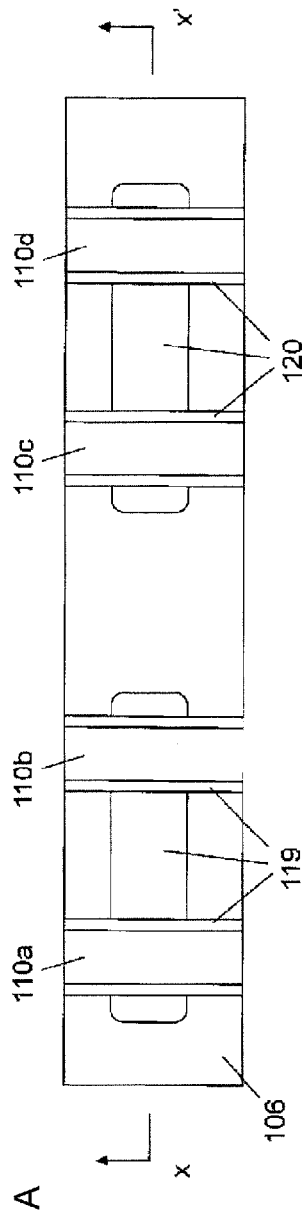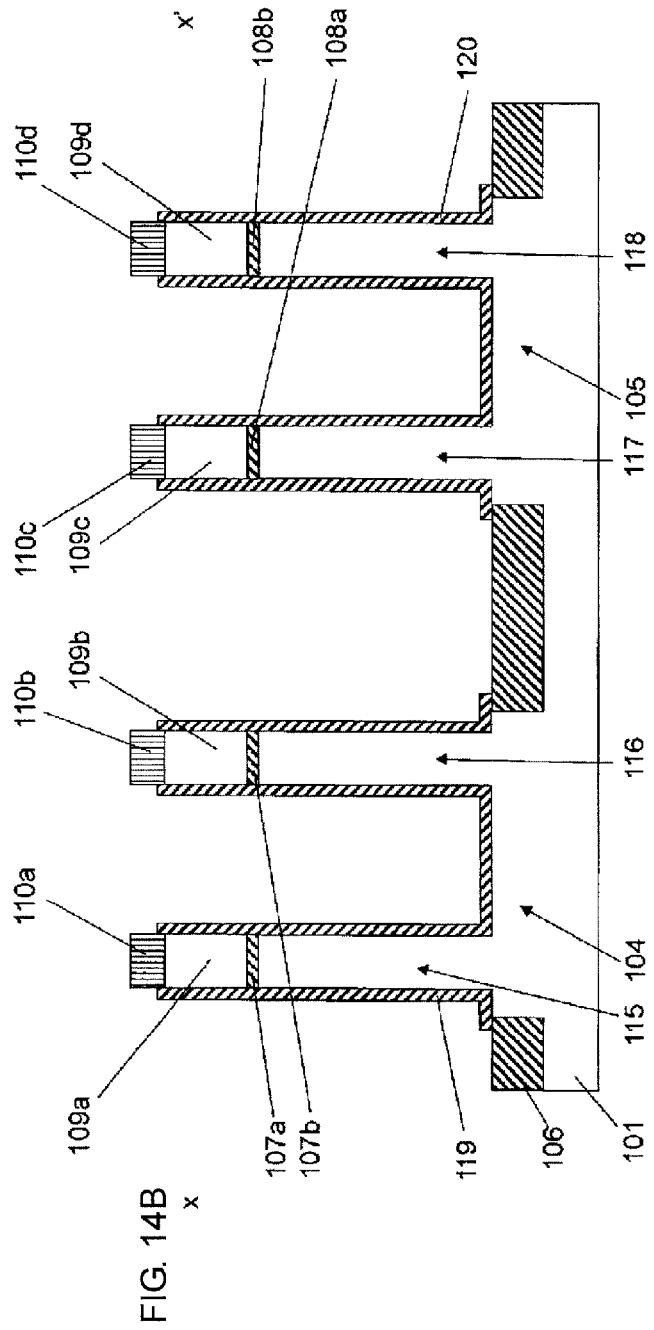

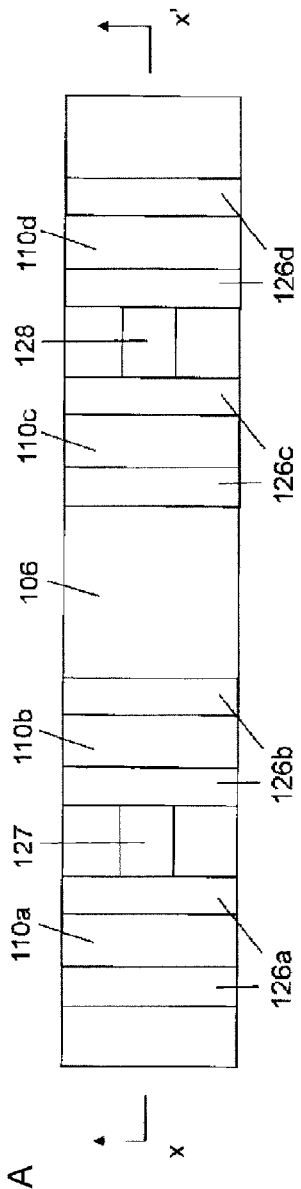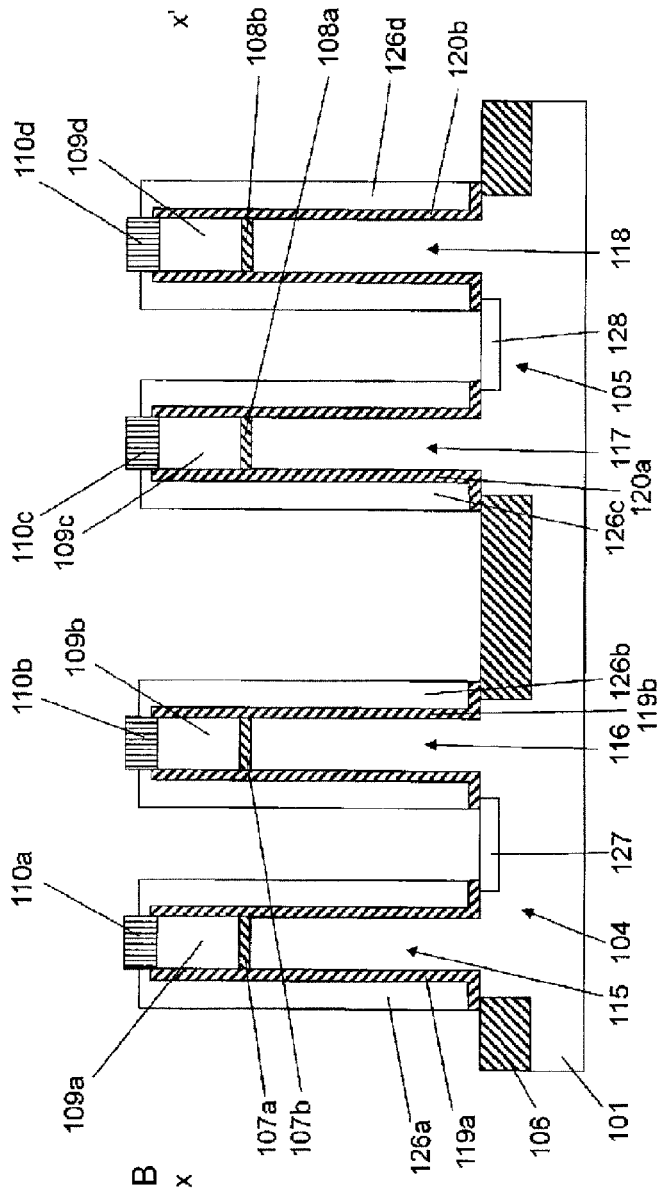

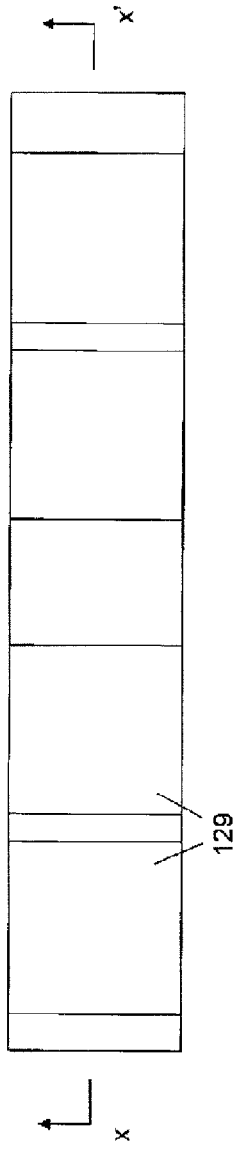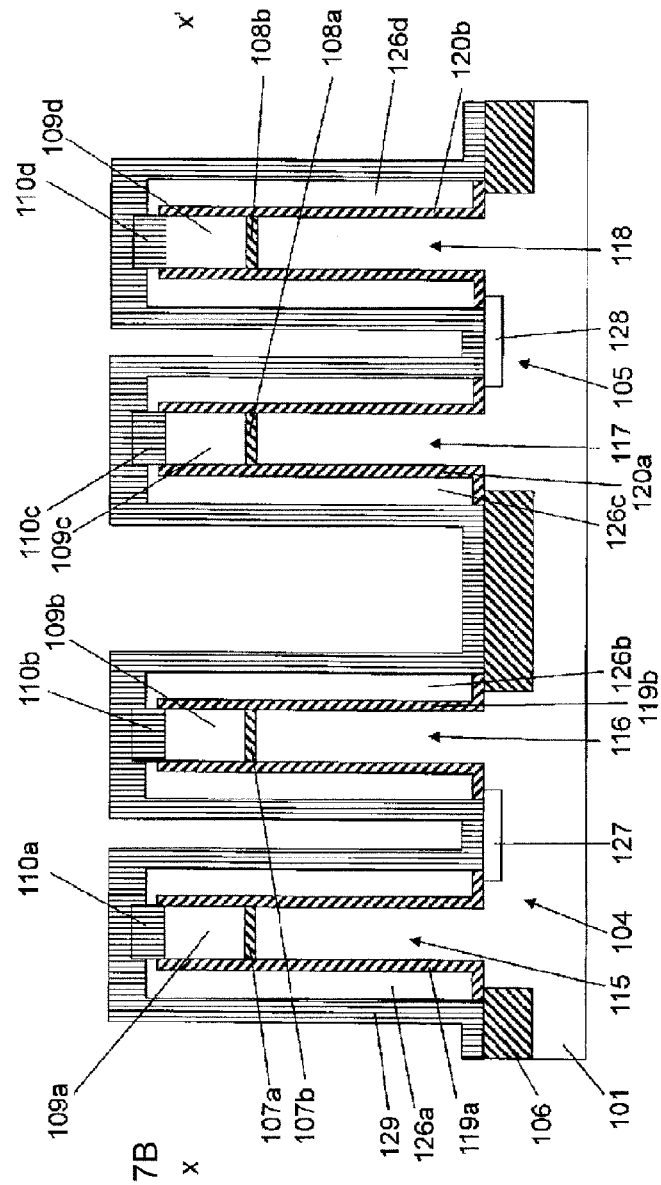
FIG. 17A
FIG. 17B

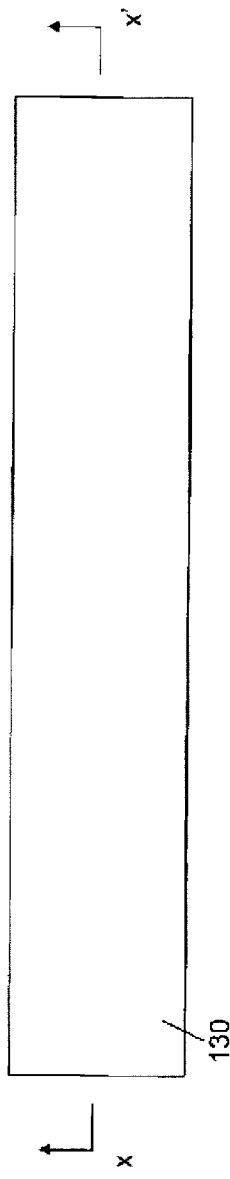
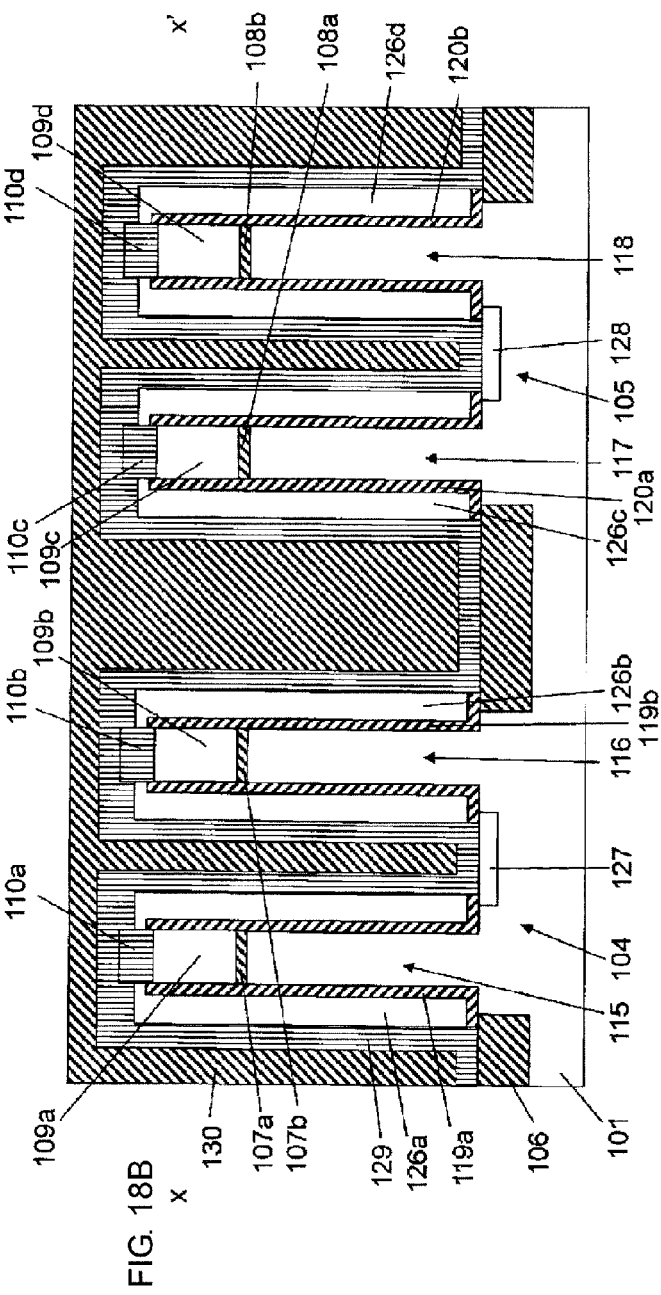
FIG. 18A
FIG. 18B

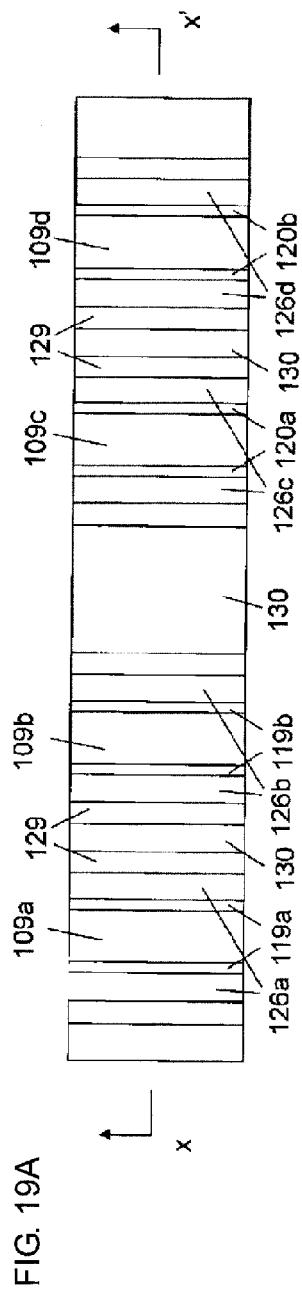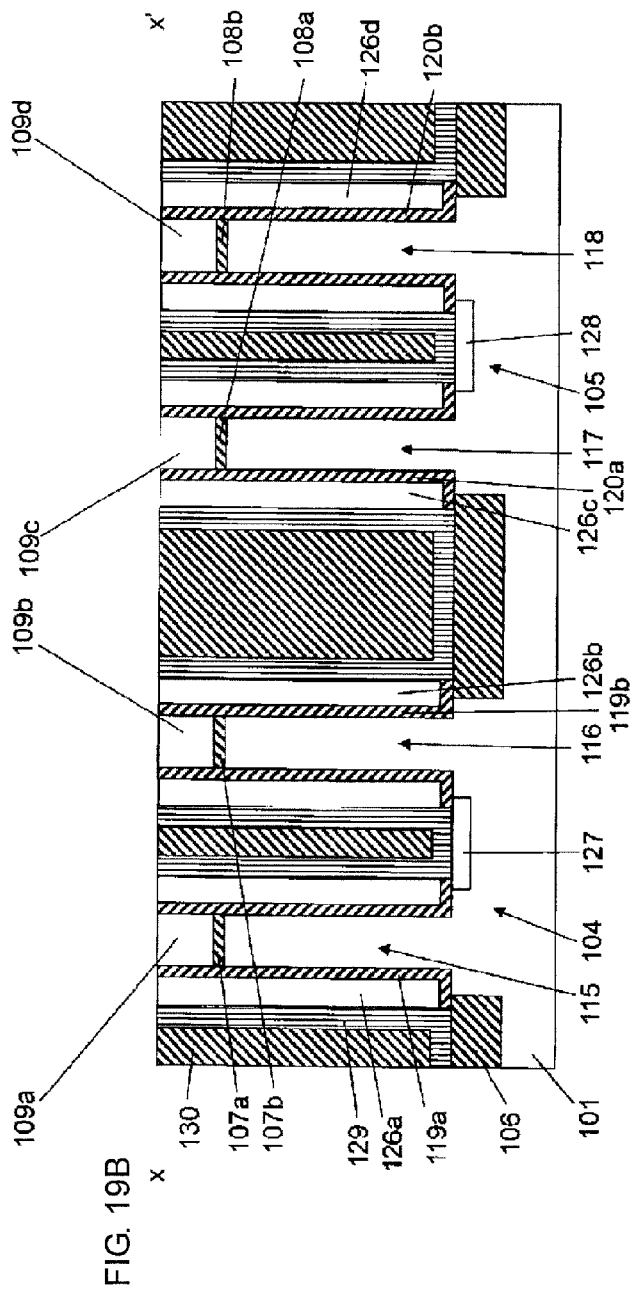

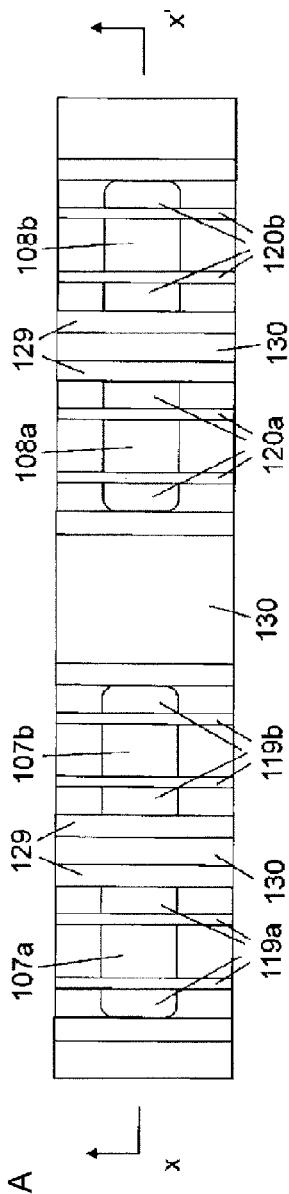
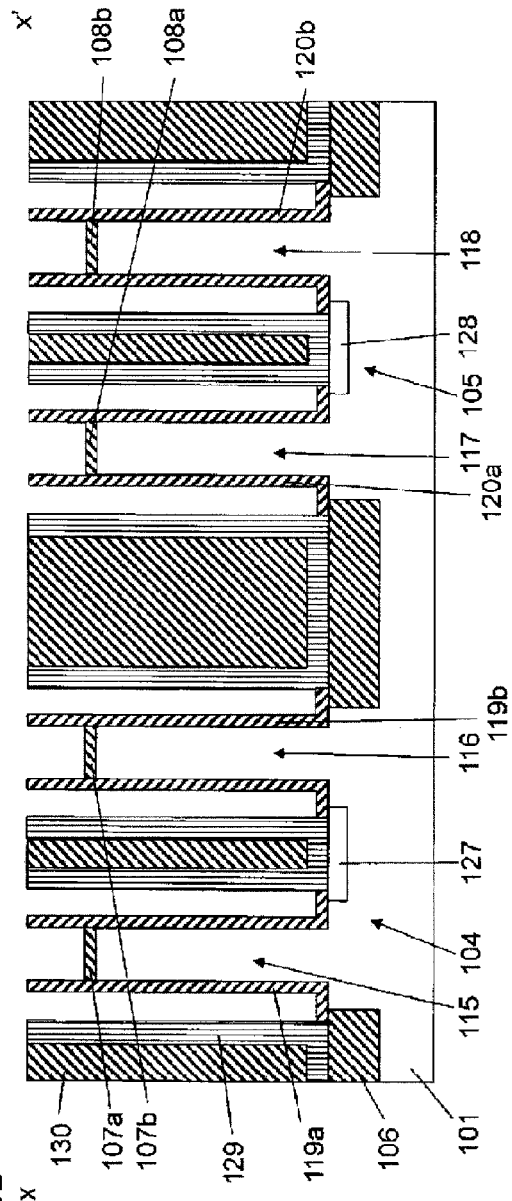
FIG. 20A
FIG. 20B

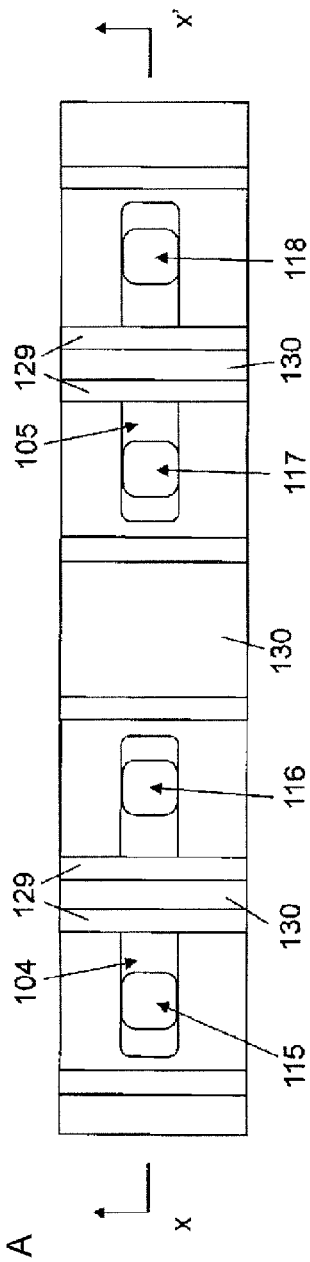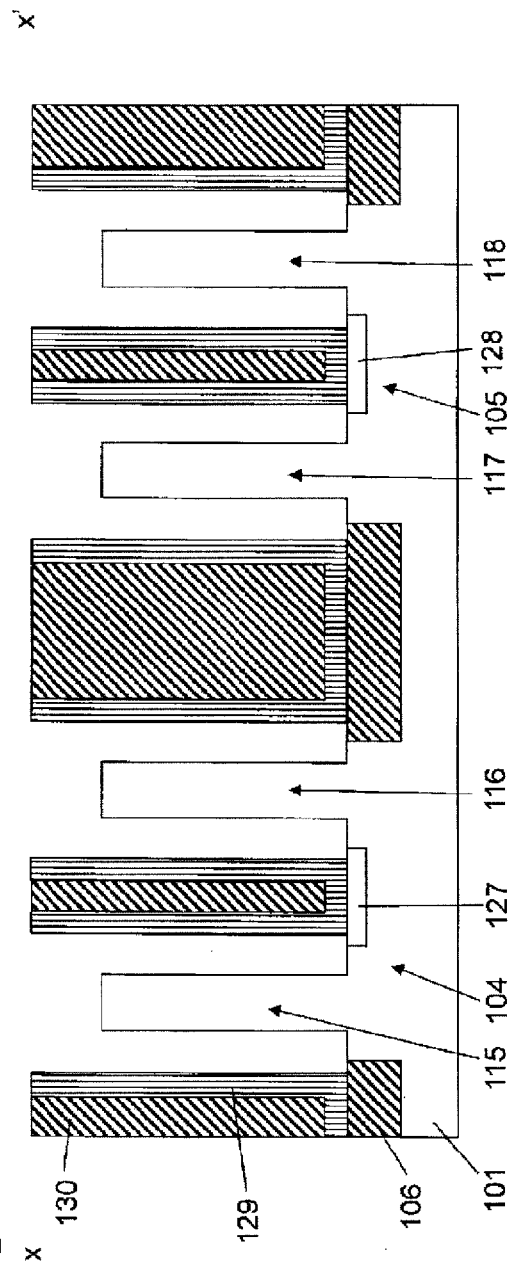

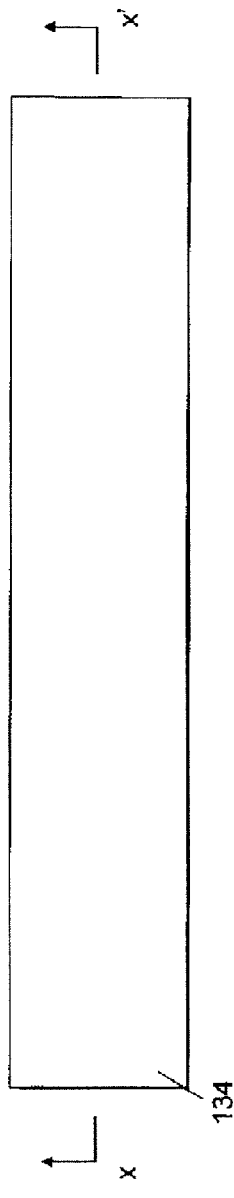
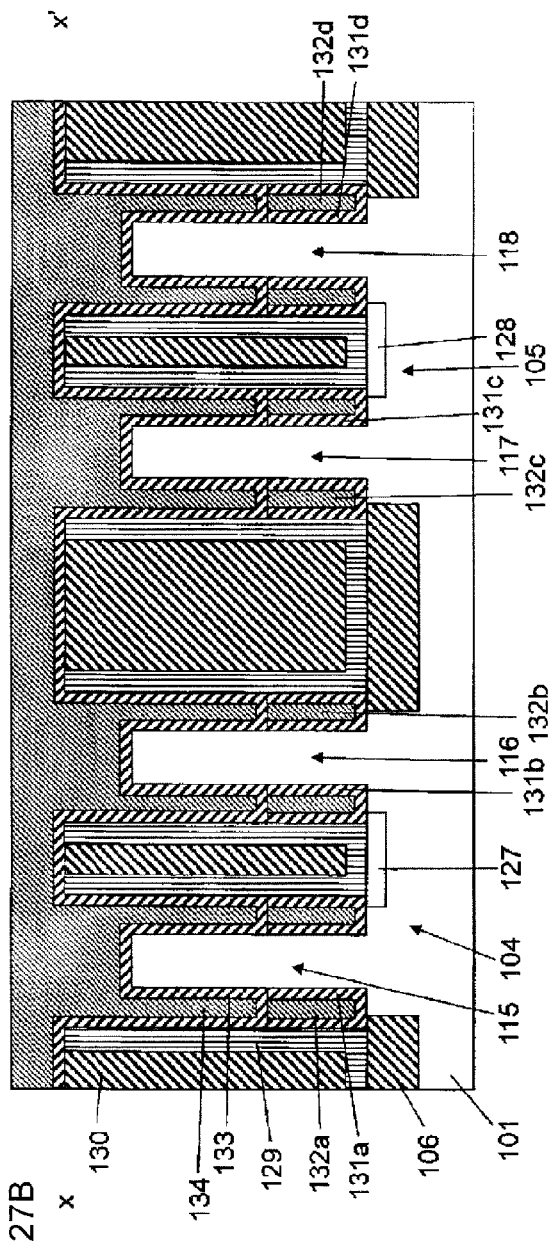
FIG. 27A
FIG. 27B

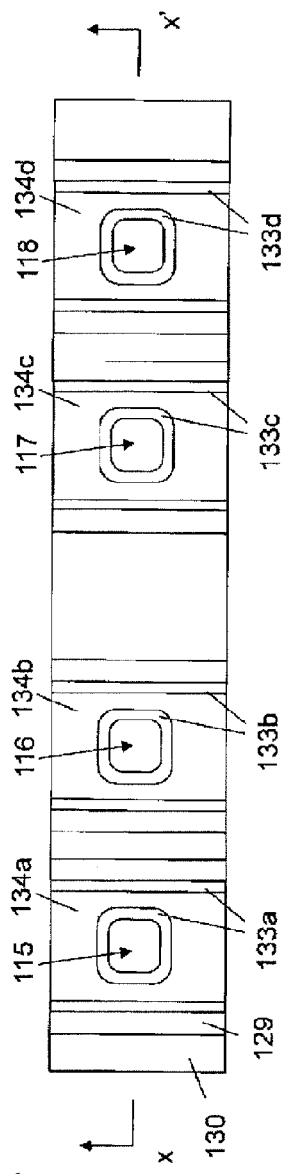
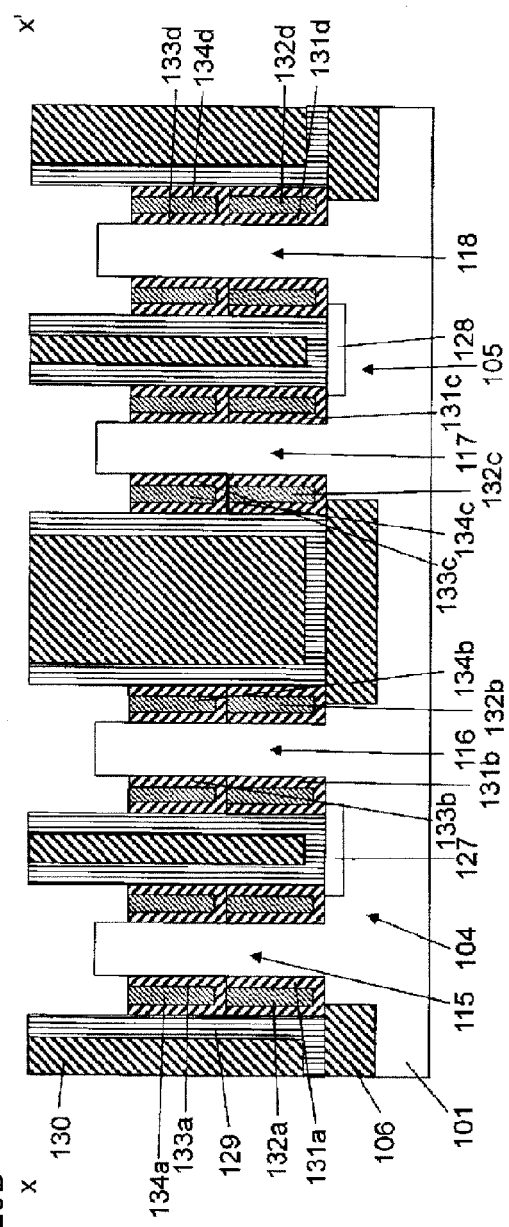
FIG. 29A
FIG. 29B

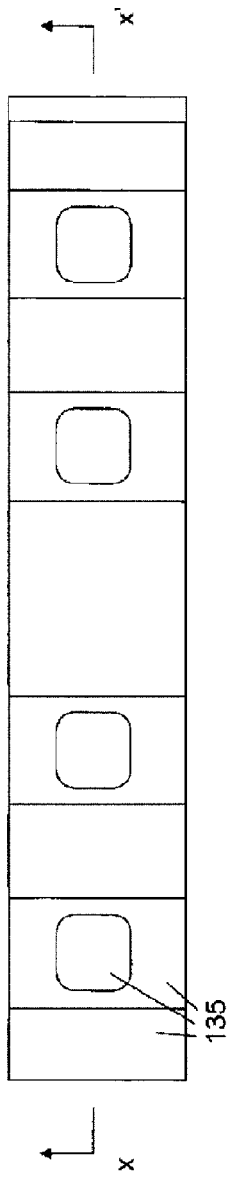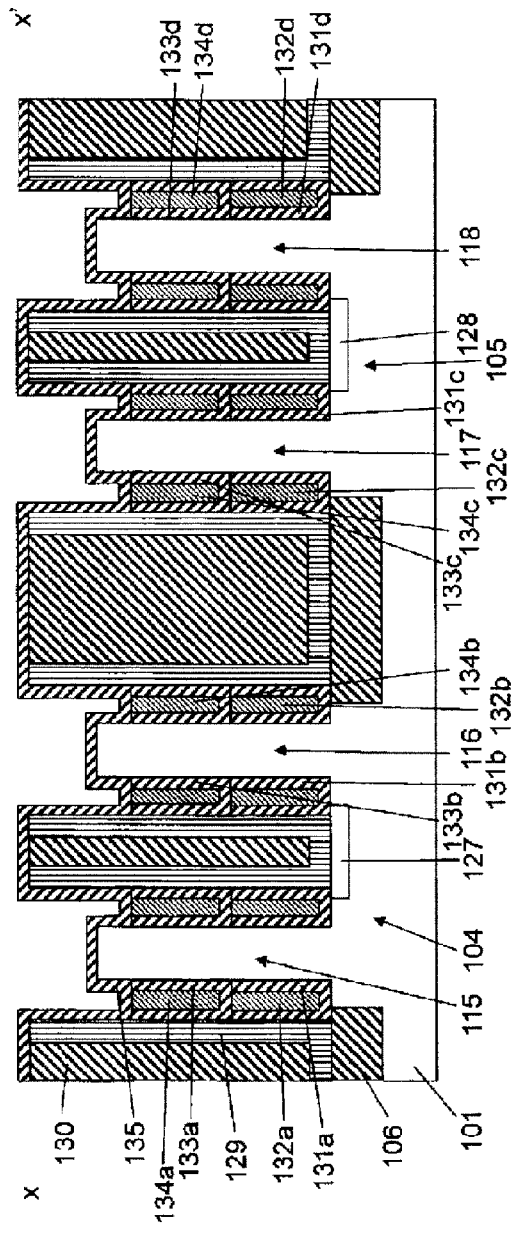
FIG. 30A
FIG. 30B

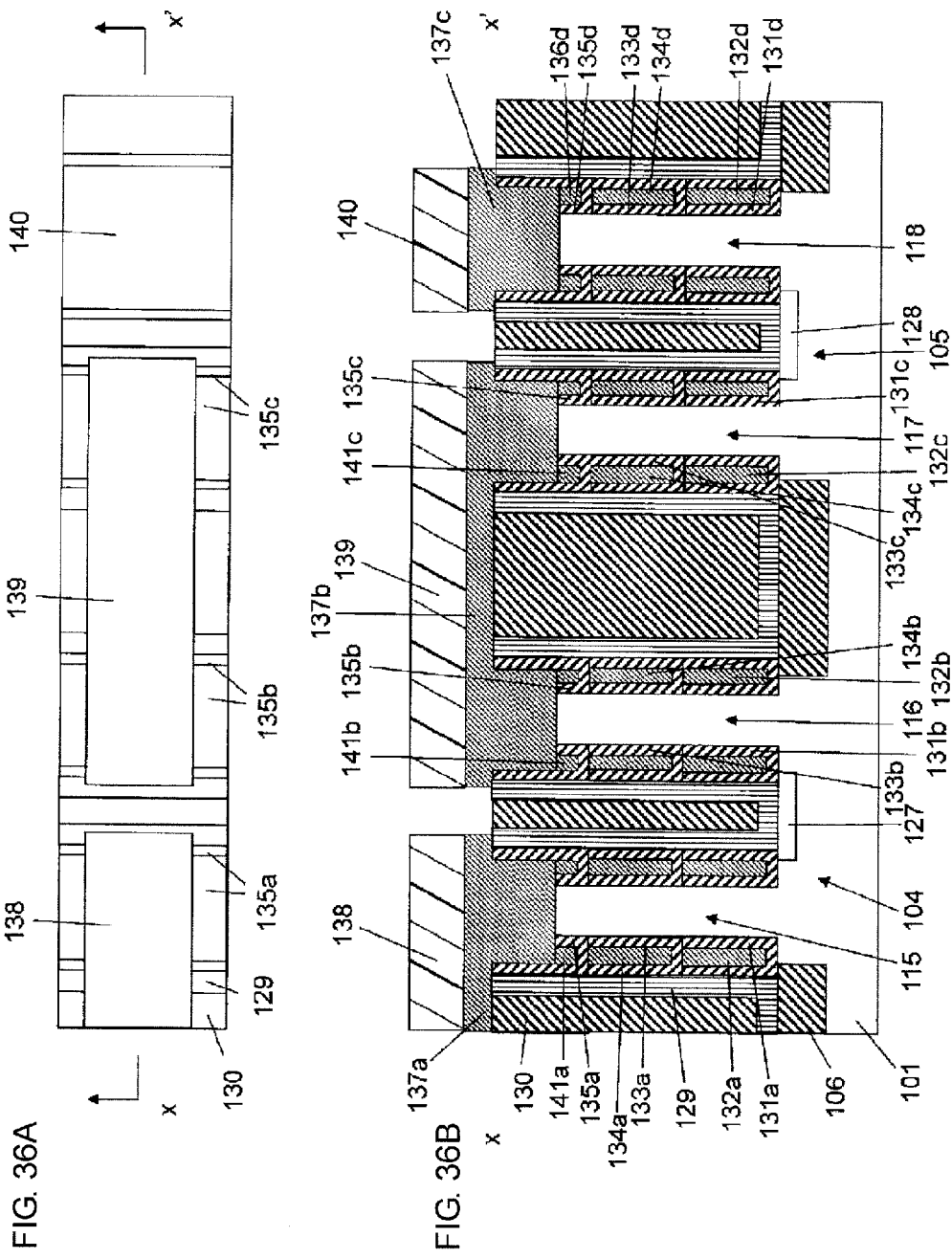

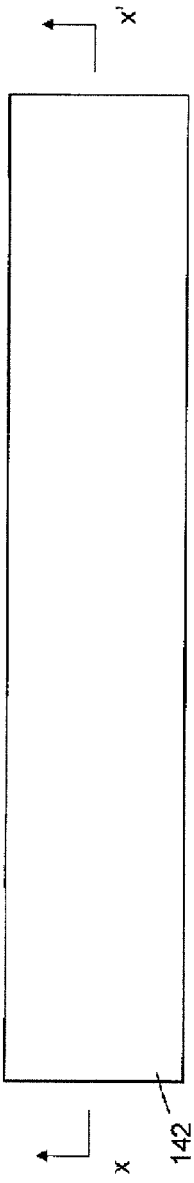
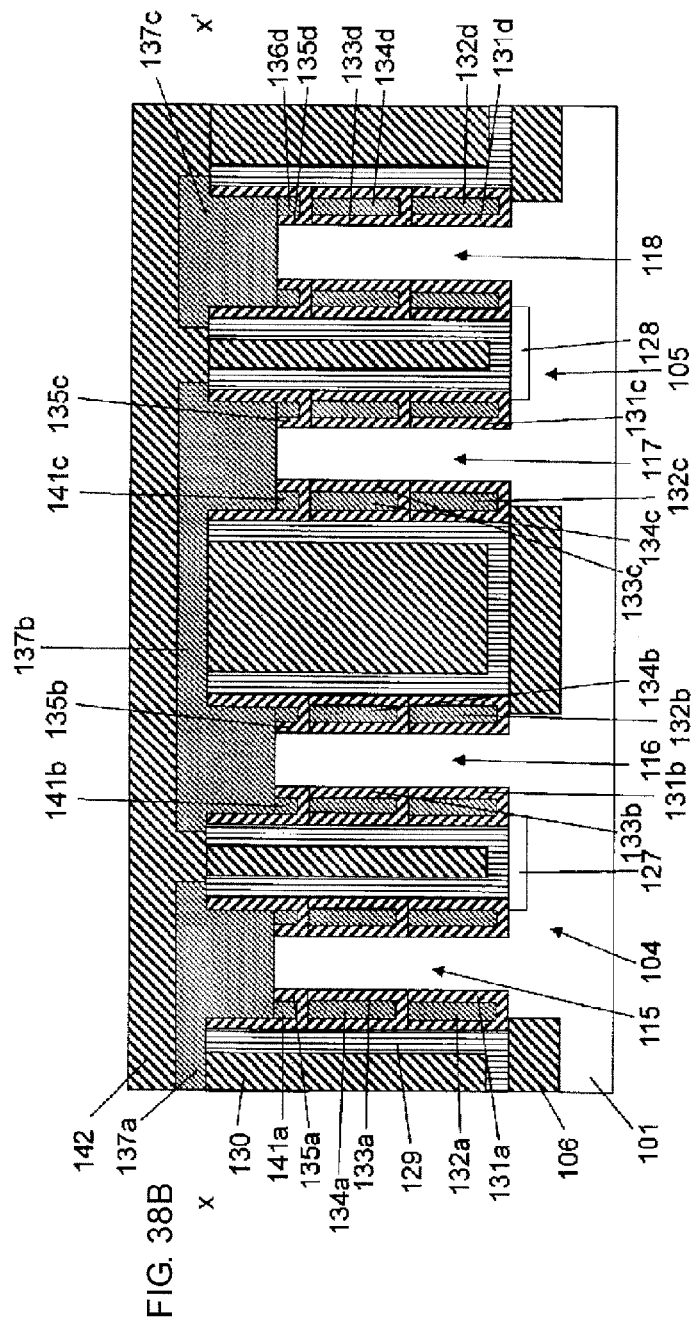
FIG. 38A
FIG. 38B

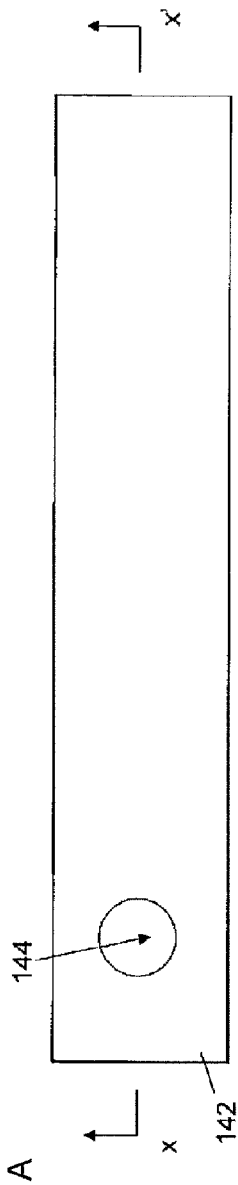
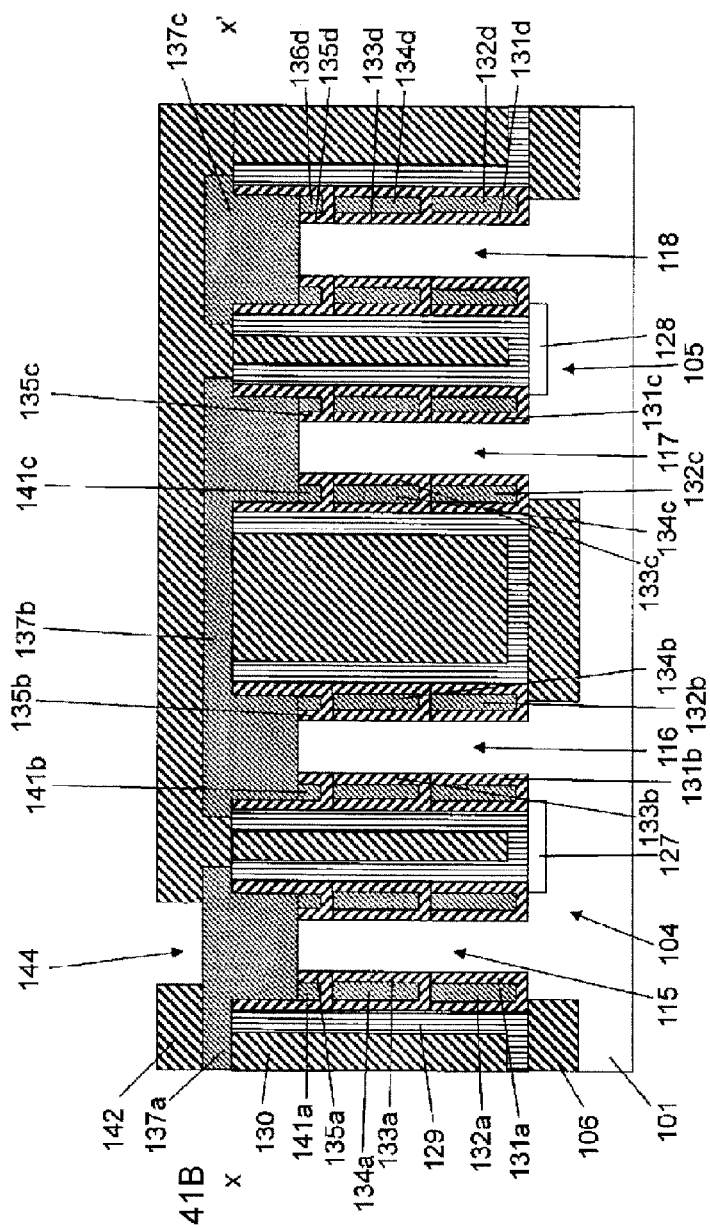
FIG. 41A
FIG. 41B

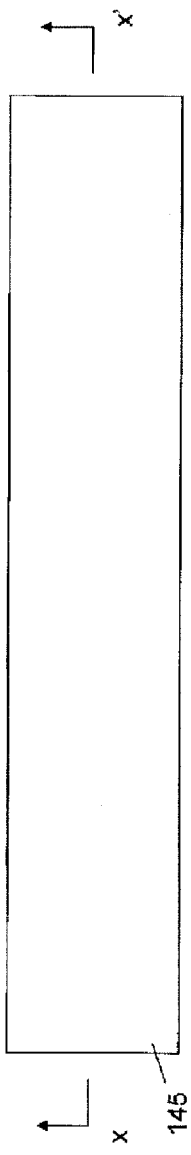
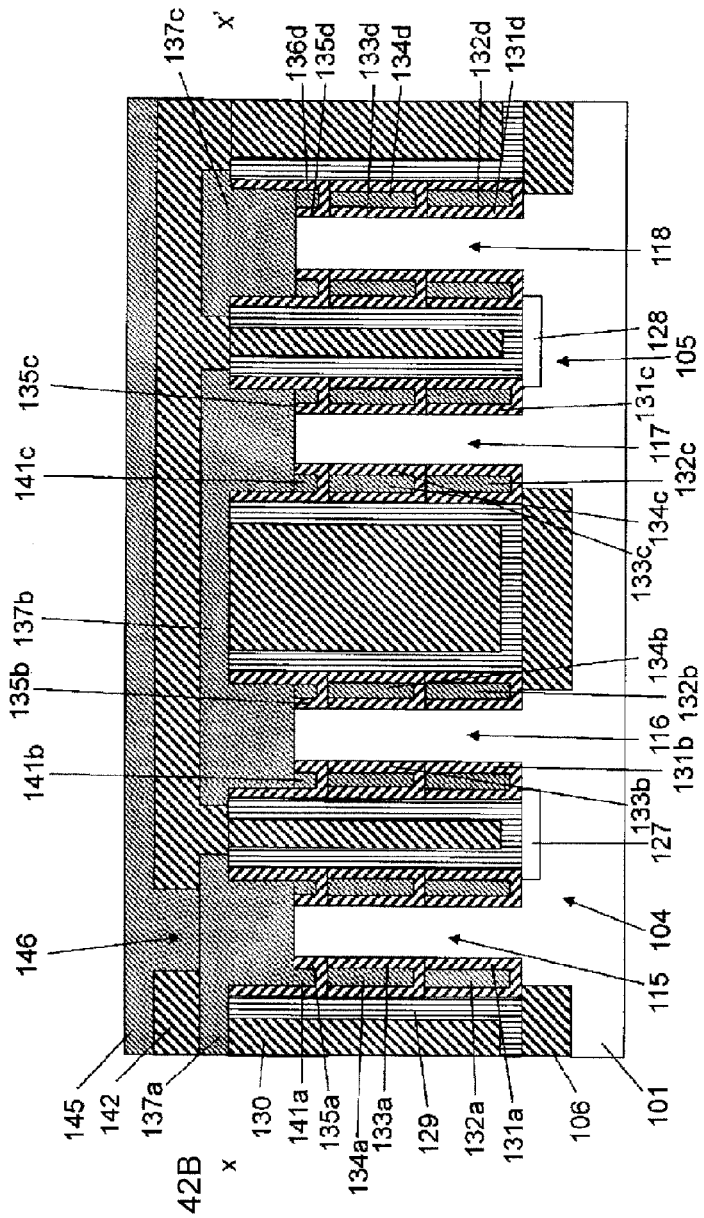
FIG. 42A
FIG. 42B

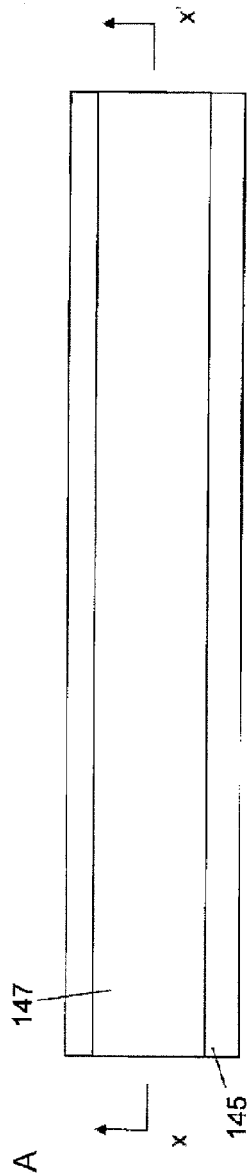
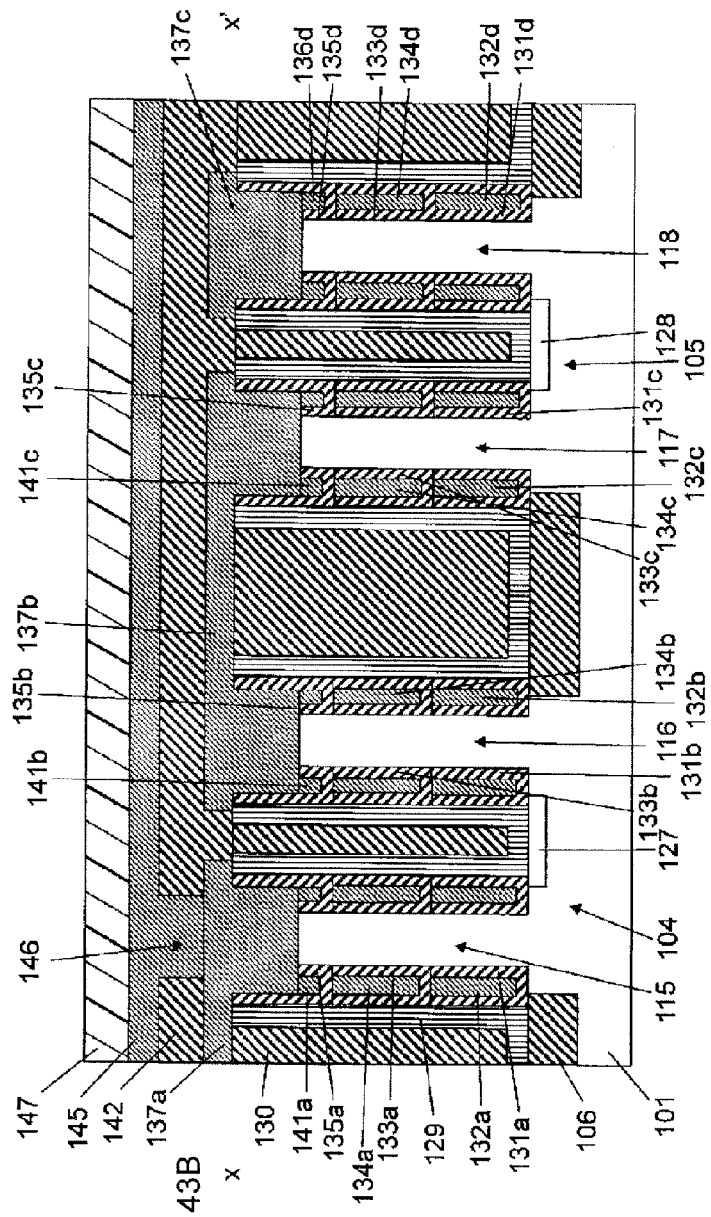
FIG. 43A
FIG. 43B

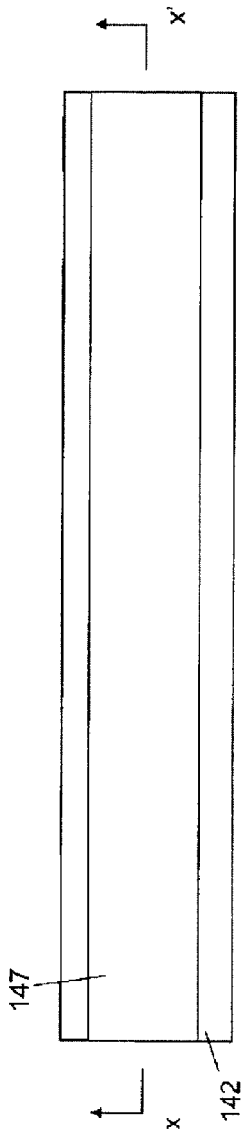
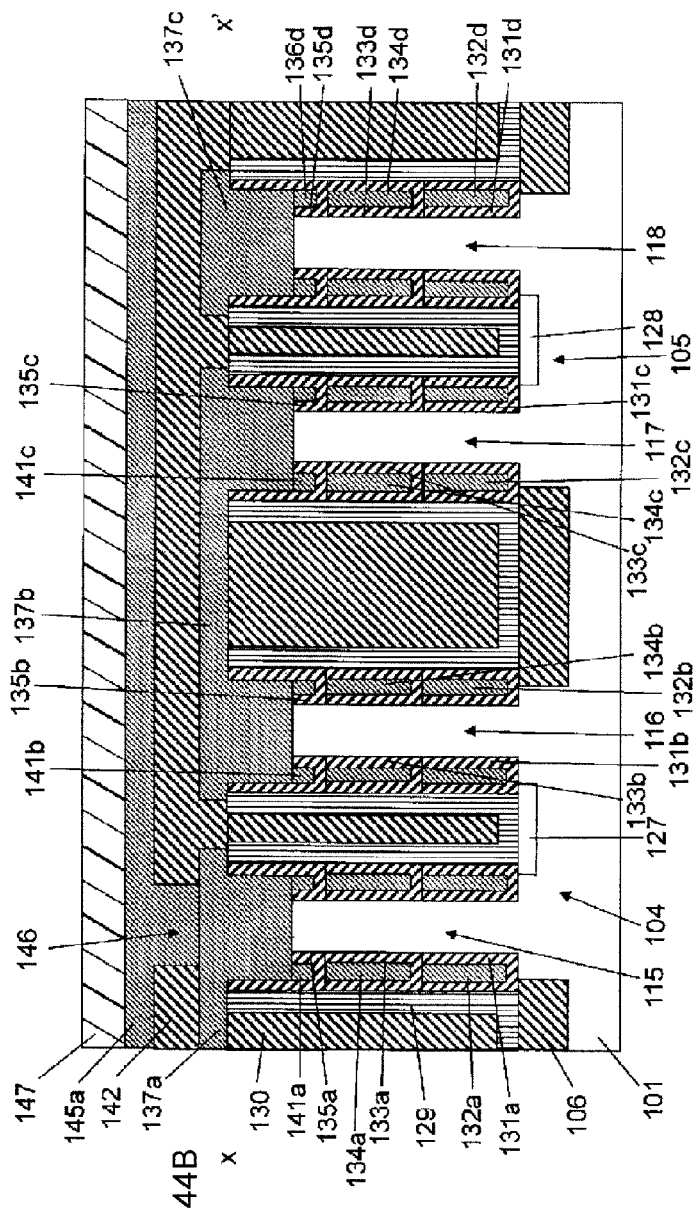
FIG. 44A
FIG. 44B

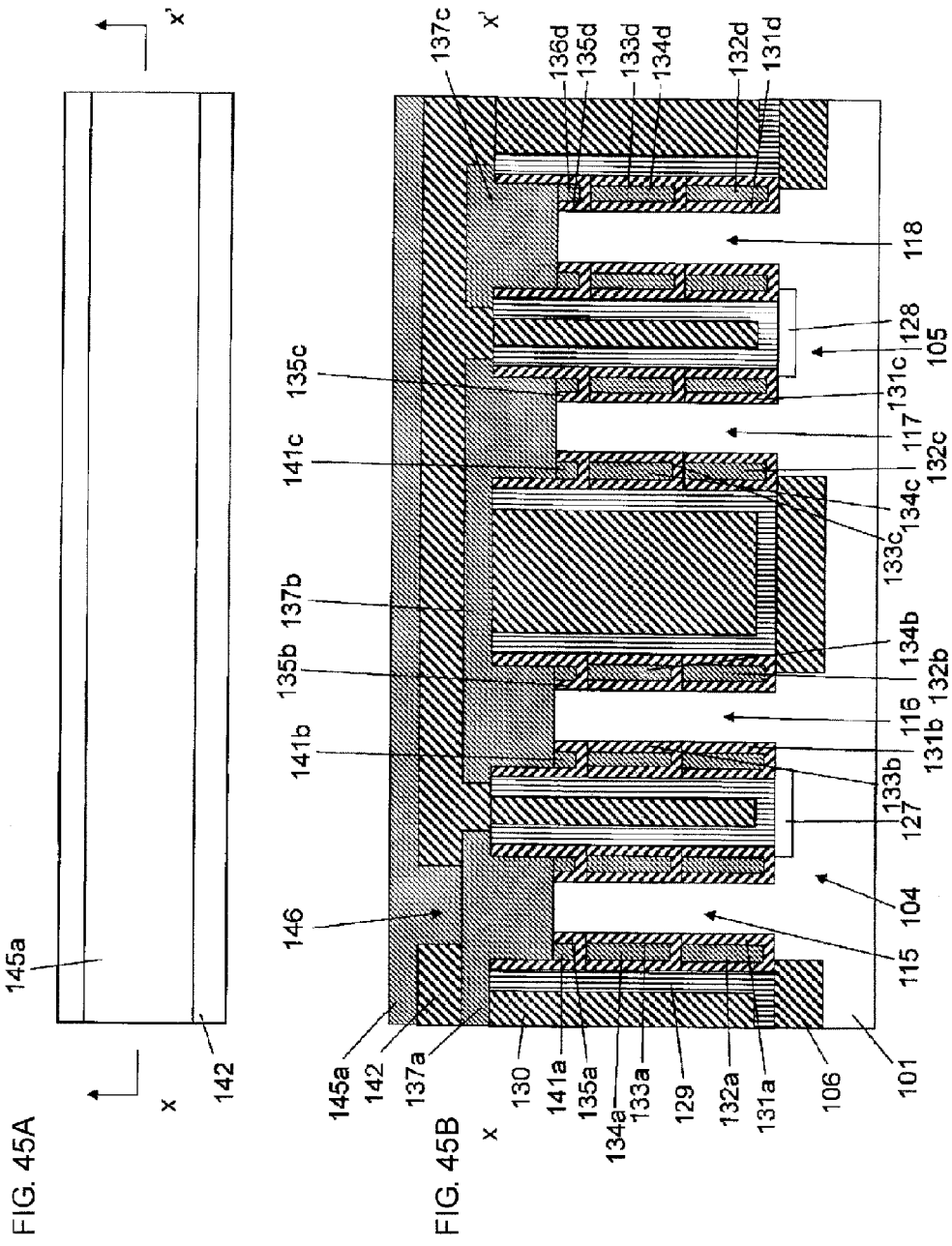

SEMICONDUCTOR DEVICE

CROSS-REFERENCE TO RELATED APPLICATION

This application is a continuation of U.S. patent application Ser. No. 15/171,433, filed Jun. 2, 2016, which is a continuation of International Patent Application PCT/JP2014/055261, with an international filing date of Mar. 3, 2014, the entire contents of which are herewith incorporated by reference.

BACKGROUND OF THE INVENTION

Field of the Invention

The present invention relates to a semiconductor device.

Description of the Related Art

In recent years, semiconductor memory devices in which memory cells are three-dimensionally arranged to increase the degree of integration of memories have been proposed (e.g., refer to Japanese Unexamined Patent Application Publication Nos. 2007-266143 and 2013-4690).

Japanese Unexamined Patent Application Publication No. 2007-266143 discloses that a plurality of memory cells are connected in series in a vertical direction, a drain selection gate is formed above the memory cells, and a source selection gate is formed below the memory cells.

Japanese Unexamined Patent Application Publication No. 2013-4690 discloses that a plurality of memory cells are connected in series in a vertical direction, and a drain selection gate or a source selection gate is formed above the memory cells.

Therefore, according to Japanese Unexamined Patent Application Publication Nos. 2007-266143 and 2013-4690, at least one or two tiers of selection gates are formed in addition to control gates whose number of tiers is equal to that of the memory cells.

When the number of gates is increased, the number of production steps increases.

Furthermore, at least one or two selection gates are formed for each pillar-shaped semiconductor layer. The selection gate itself does not store any information. Moreover, at least one or two circuits for driving a selection gate are required for each pillar-shaped semiconductor layer.

As the width of a silicon pillar decreases, it becomes more difficult to make an impurity be present in the silicon pillar because the density of silicon is $5 \times 10^{22}/cm^3$.

In known SGTs, it has been proposed that the channel concentration is set to be a low impurity concentration of $10^{17}$ cm-3 or less and the threshold voltage is determined by changing the work function of a gate material (e.g., refer to Japanese Unexamined Patent Application Publication No. 2004-356314).

It has been disclosed that, in planar MOS transistors, the sidewall of an LDD region is formed of a polycrystalline silicon having the same conductivity type as a low-concentration layer, surface carriers of the LDD region are induced by the difference in work function, and thus the impedance of the LDD region can be reduced compared with LDD MOS transistors with an oxide film sidewall (e.g., refer to Japanese Unexamined Patent Application Publication No. 11-297984). It has also been disclosed that the polycrystalline silicon sidewall is electrically insulated from a gate electrode. The drawings show that the polycrystalline silicon sidewall is insulated from a source and a drain by an interlayer insulating film.

BRIEF SUMMARY OF THE INVENTION

It is accordingly an object of the invention to provide a semiconductor device which overcomes the above-mentioned and other disadvantages of the heretofore-known devices and methods of this general type and which provides for a structure of a semiconductor device in which the number of selection gates for each pillar-shaped semiconductor layer is decreased.

A semiconductor device according to an aspect of the present invention includes a first pillar-shaped semiconductor layer; a first selection gate insulating film surrounding the first pillar-shaped semiconductor layer; a first selection gate surrounding the first selection gate insulating film; a first gate insulating film surrounding an upper portion of the first pillar-shaped semiconductor layer; a first contact electrode surrounding the first gate insulating film; a first bit line connected to an upper portion of the first pillar-shaped semiconductor layer and an upper portion of the first contact electrode; a second pillar-shaped semiconductor layer; a layer including a first charge storage layer and surrounding the second pillar-shaped semiconductor layer; a first control gate surrounding the layer including the first charge storage layer; a layer including a second charge storage layer, surrounding the second pillar-shaped semiconductor layer, and formed above the first control gate; a second control gate surrounding the layer including the second charge storage layer; a second gate insulating film surrounding an upper portion of the second pillar-shaped semiconductor layer; a second contact electrode surrounding the second gate insulating film and having an upper portion connected to an upper portion of the second pillar-shaped semiconductor layer; a first lower internal line that connects a lower portion of the first pillar-shaped semiconductor layer and a lower portion of the second pillar-shaped semiconductor layer; a third pillar-shaped semiconductor layer; a layer including a third charge storage layer and surrounding the third pillar-shaped semiconductor layer; a third control gate surrounding the layer including the third charge storage layer; a layer including a fourth charge storage layer, surrounding the third pillar-shaped semiconductor layer, and formed above the third control gate; a fourth control gate surrounding the layer including the fourth charge storage layer; a third gate insulating film surrounding an upper portion of the third pillar-shaped semiconductor layer; a third contact electrode surrounding the third gate insulating film and having an upper portion connected to an upper portion of the third pillar-shaped semiconductor layer; a fourth pillar-shaped semiconductor layer; a second selection gate insulating film surrounding the fourth pillar-shaped semiconductor layer; a second selection gate surrounding the second selection gate insulating film; a fourth gate insulating film surrounding an upper portion of the fourth pillar-shaped semiconductor layer; a fourth contact electrode surrounding the fourth gate insulating film; a first source line connected to an upper portion of the fourth pillar-shaped semiconductor layer and the fourth contact electrode; and a second lower internal line that connects a lower portion of the third pillar-shaped semiconductor layer and a lower portion of the fourth pillar-shaped semiconductor layer.

The second control gate may be one of a plurality of second control gates and the fourth control gate may be one of a plurality of fourth control gates, the second control gates and the fourth control gates being arranged in a direction perpendicular to a substrate.

The semiconductor device may further include a fifth pillar-shaped semiconductor layer; a layer including a fifth charge storage layer and surrounding the fifth pillar-shaped semiconductor layer; a fifth control gate surrounding the layer including the fifth charge storage layer; a layer including a sixth charge storage layer, surrounding the fifth pillar-shaped semiconductor layer, and formed above the fifth control gate; a sixth control gate surrounding the layer including the sixth charge storage layer; a fifth gate insulating film surrounding an upper portion of the fifth pillar-shaped semiconductor layer; a fifth contact electrode surrounding the fifth gate insulating film and having an upper portion connected to an upper portion of the fifth pillar-shaped semiconductor layer; a sixth pillar-shaped semiconductor layer; a layer including a seventh charge storage layer and surrounding the sixth pillar-shaped semiconductor layer; a seventh control gate surrounding the layer including the seventh charge storage layer; a layer including an eighth charge storage layer, surrounding the sixth pillar-shaped semiconductor layer, and formed above the seventh control gate; an eighth control gate surrounding the layer including the eighth charge storage layer; a sixth gate insulating film surrounding an upper portion of the sixth pillar-shaped semiconductor layer; a sixth contact electrode surrounding the sixth gate insulating film and having an upper portion connected to an upper portion of the sixth pillar-shaped semiconductor layer; a third lower internal line that connects a lower portion of the fifth pillar-shaped semiconductor layer and a lower portion of the sixth pillar-shaped semiconductor layer; and a first upper internal line that connects the upper portion of the second pillar-shaped semiconductor layer, the upper portion of the second contact electrode, the upper portion of the fifth pillar-shaped semiconductor layer, and the upper portion of the fifth contact electrode.

The sixth control gate may be one of a plurality of sixth control gates and the eighth control gate may be one of a plurality of eighth control gates, the sixth control gates and the eighth control gates being arranged in a direction perpendicular to a substrate.

The semiconductor device may further include a seventh pillar-shaped semiconductor layer; a layer including a ninth charge storage layer and surrounding the seventh pillar-shaped semiconductor layer; a ninth control gate surrounding the layer including the ninth charge storage layer; a layer including a tenth charge storage layer, surrounding the seventh pillar-shaped semiconductor layer, and formed above the ninth control gate; a tenth control gate surrounding the layer including the tenth charge storage layer; a seventh gate insulating film surrounding an upper portion of the seventh pillar-shaped semiconductor layer; a seventh contact electrode surrounding the seventh gate insulating film and having an upper portion connected to an upper portion of the seventh pillar-shaped semiconductor layer; an eighth pillar-shaped semiconductor layer; a layer including an eleventh charge storage layer and surrounding the eighth pillar-shaped semiconductor layer; an eleventh control gate surrounding the layer including the eleventh charge storage layer; a layer including a twelfth charge storage layer, surrounding the eighth pillar-shaped semiconductor layer, and formed above the eleventh control gate; a twelfth control gate surrounding the layer including the twelfth charge storage layer; an eighth gate insulating film surrounding an upper portion of the eighth pillar-shaped semiconductor layer; an eighth contact electrode surrounding the eighth gate insulating film and having an upper portion connected to an upper portion of the eighth pillar-shaped semiconductor layer; a fourth lower internal line that connects a lower portion of the seventh pillar-shaped semiconductor layer and a lower portion of the eighth pillar-shaped semiconductor layer; and a second upper internal line that connects the upper portion of the third pillar-shaped semiconductor layer, the upper portion of the third contact electrode, the upper portion of the eighth pillar-shaped semiconductor layer, and the upper portion of the eighth contact electrode.

The tenth control gate may be one of a plurality of tenth control gates and the twelfth control gate may be one of a plurality of twelfth control gates, the tenth control gates and the twelfth control gates being arranged in a direction perpendicular to a substrate.

The semiconductor device may further include a first fin-shaped semiconductor layer formed below the first pillar-shaped semiconductor layer and the second pillar-shaped semiconductor layer; and a second fin-shaped semiconductor layer formed below the third pillar-shaped semiconductor layer and the fourth pillar-shaped semiconductor layer, wherein the first lower internal line is formed in the first fin-shaped semiconductor layer, and the second lower internal line is formed in the second fin-shaped semiconductor layer.

The semiconductor device may further include a third fin-shaped semiconductor layer formed below the fifth pillar-shaped semiconductor layer and the sixth pillar-shaped semiconductor layer, wherein the third lower internal line is formed in the third fin-shaped semiconductor layer.

The semiconductor device may further include a fourth fin-shaped semiconductor layer formed below the seventh pillar-shaped semiconductor layer and the eighth pillar-shaped semiconductor layer, wherein the fourth lower internal line is formed in the fourth fin-shaped semiconductor layer.

A first element separation film may be formed around the first fin-shaped semiconductor layer and the second fin-shaped semiconductor layer.

A third selection gate may be formed below the first selection gate.

A fourth selection gate may be formed below the second selection gate.

A thirteenth control gate may be formed below the first selection gate.

A fourteenth control gate may be formed below the second selection gate.

The first lower internal line may be a first diffusion layer, and the second lower internal line may be a second diffusion layer.

The third lower internal line may be a third diffusion layer.

The fourth lower internal line may be a fourth diffusion layer.

A metal for the first contact electrode, the second contact electrode, the third contact electrode, and the fourth contact electrode may have a work function of 4.0 eV to 4.2 eV.

A metal for the first contact electrode, the second contact electrode, the third contact electrode, and the fourth contact electrode may have a work function of 5.0 eV to 5.2 eV.

A metal for the fifth contact electrode and the sixth contact electrode may have a work function of 4.0 eV to 4.2 eV.

A metal for the fifth contact electrode and the sixth contact electrode may have a work function of 5.0 eV to 5.2 eV.

A metal for the seventh contact electrode and the eighth contact electrode may have a work function of 4.0 eV to 4.2 eV.

A metal for the seventh contact electrode and the eighth contact electrode may have a work function of 5.0 eV to 5.2 eV.

The layer including the first charge storage layer may include a nitride film as a charge storage layer.

The present invention can provide a structure of a semiconductor device in which the number of selection gates per pillar-shaped semiconductor layer is decreased.

Pillar-shaped semiconductor layers around which a selection gate is formed and pillar-shaped semiconductor layers around which only a control gate is formed are used. The pillar-shaped semiconductor layers (number: m) around which only a control gate is formed are arranged in a line, and the pillar-shaped semiconductor layers around which a selection gate is formed are disposed at the ends of the line. These pillar-shaped semiconductor layers are connected to each other using lower internal lines, each of which connects lower portions of the adjacent pillar-shaped semiconductor layers, and upper internal lines, each of which connects upper portions of the adjacent pillar-shaped semiconductor layers, so that memory cells are connected in series. Therefore, the number of selection gates per pillar-shaped semiconductor layer is 2/m.

When m is 32, the number of selection gates per pillar-shaped semiconductor layer is 2/32. When m is 64, the number of selection gates per pillar-shaped semiconductor layer is 2/64. Thus, the number of circuits for driving a selection gate can be decreased.

Furthermore, since the pillar-shaped semiconductor layers around which only a control gate is formed are used, the number of gates can be decreased by one or two. This can decrease the number of production steps.

If a metal gate-last process is used for an SGT, an upper portion of a pillar-shaped semiconductor layer is covered with a polysilicon gate. Therefore, it is difficult to form a diffusion layer in the upper portion of the pillar-shaped semiconductor layer. This requires formation of a diffusion layer in the upper portion of the pillar-shaped semiconductor layer before formation of a polysilicon gate. In contrast, according to the present invention, the upper portion of a pillar-shaped semiconductor layer can be made to function as an n-type semiconductor layer or a p-type semiconductor layer by the difference in work function between metal and semiconductor without forming a diffusion layer in the upper portion of the pillar-shaped semiconductor layer. Accordingly, a step of forming a diffusion layer in an upper portion of a pillar-shaped semiconductor layer can be omitted.

Other features which are considered as characteristic for the invention are set forth in the appended claims.

Although the invention is illustrated and described herein as embodied in a semiconductor device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 2A is a plan view illustrating a semiconductor device according to an embodiment of the present invention and FIG. 2B is a sectional view taken along line X-X' in FIG. 2A.

FIG. 3A is a plan view illustrating a method for producing a semiconductor device according to an embodiment of the present invention and FIG. 3B is a sectional view taken along line X-X' in FIG. 3A.

FIG. 4A is a plan view illustrating a method for producing a semiconductor device according to an embodiment of the present invention and FIG. 4B is a sectional view taken along line X-X' in FIG. 4A.

FIG. 5A is a plan view illustrating a method for producing a semiconductor device according to an embodiment of the present invention and FIG. 5B is a sectional view taken along line X-X' in FIG. 5A.

FIG. 6A is a plan view illustrating a method for producing a semiconductor device according to an embodiment of the present invention and FIG. 6B is a sectional view taken along line X-X' in FIG. 6A.

FIG. 7A is a plan view illustrating a method for producing a semiconductor device according to an embodiment of the present invention and FIG. 7B is a sectional view taken along line X-X' in FIG. 7A.

FIG. 8A is a plan view illustrating a method for producing a semiconductor device according to an embodiment of the present invention and FIG. 8B is a sectional view taken along line X-X' in FIG. 8A.

FIG. 9A is a plan view illustrating a method for producing a semiconductor device according to an embodiment of the present invention and FIG. 9B is a sectional view taken along line X-X' in FIG. 9A.

FIG. 11A is a plan view illustrating a method for producing a semiconductor device according to an embodiment of the present invention and FIG. 11B is a sectional view taken along line X-X' in FIG. 11A.

FIG. 13A is a plan view illustrating a method for producing a semiconductor device according to an embodiment of the present invention and FIG. 13B is a sectional view taken along line X-X' in FIG. 13A.

FIG. 14A is a plan view illustrating a method for producing a semiconductor device according to an embodiment of the present invention and FIG. 14B is a sectional view taken along line X-X' in FIG. 14A.

FIG. 16A is a plan view illustrating a method for producing a semiconductor device according to an embodiment of the present invention and FIG. 16B is a sectional view taken along line X-X' in FIG. 16A.

FIG. 17A is a plan view illustrating a method for producing a semiconductor device according to an embodiment of the present invention and FIG. 17B is a sectional view taken along line X-X' in FIG. 17A.

FIG. 18A is a plan view illustrating a method for producing a semiconductor device according to an embodiment of the present invention and FIG. 18B is a sectional view taken along line X-X' in FIG. 18A.

FIG. 19A is a plan view illustrating a method for producing a semiconductor device according to an embodiment of the present invention and FIG. 19B is a sectional view taken along line X-X' in FIG. 19A.

FIG. 20A is a plan view illustrating a method for producing a semiconductor device according to an embodiment of the present invention and FIG. 20B is a sectional view taken along line X-X' in FIG. 20A.

FIG. 21A is a plan view illustrating a method for producing a semiconductor device according to an embodiment of the present invention and FIG. 21B is a sectional view taken along line X-X' in FIG. 21A.

FIG. 27A is a plan view illustrating a method for producing a semiconductor device according to an embodiment of the present invention and FIG. 27B is a sectional view taken along line X-X' in FIG. 27A.

FIG. 29A is a plan view illustrating a method for producing a semiconductor device according to an embodiment of the present invention and FIG. 29B is a sectional view taken along line X-X' in FIG. 29A.

FIG. 30A is a plan view illustrating a method for producing a semiconductor device according to an embodiment of the present invention and FIG. 30B is a sectional view taken along line X-X' in FIG. 30A.

FIG. 36A is a plan view illustrating a method for producing a semiconductor device according to an embodiment of the present invention and FIG. 36B is a sectional view taken along line X-X' in FIG. 36A.

FIG. 38A is a plan view illustrating a method for producing a semiconductor device according to an embodiment of the present invention and FIG. 38B is a sectional view taken along line X-X' in FIG. 38A.

FIG. 41A is a plan view illustrating a method for producing a semiconductor device according to an embodiment of the present invention and FIG. 41B is a sectional view taken along line X-X' in FIG. 41A.

FIG. 42A is a plan view illustrating a method for producing a semiconductor device according to an embodiment of the present invention and FIG. 42B is a sectional view taken along line X-X' in FIG. 42A.

FIG. 43A is a plan view illustrating a method for producing a semiconductor device according to an embodiment of the present invention and FIG. 43B is a sectional view taken along line X-X' in FIG. 43A.

FIG. 44A is a plan view illustrating a method for producing a semiconductor device according to an embodiment of the present invention and FIG. 44B is a sectional view taken along line X-X' in FIG. 44A.

FIG. 45A is a plan view illustrating a method for producing a semiconductor device according to an embodiment of the present invention and FIG. 45B is a sectional view taken along line X-X' in FIG. 45A.

DETAILED DESCRIPTION OF THE INVENTION

Figure 1:
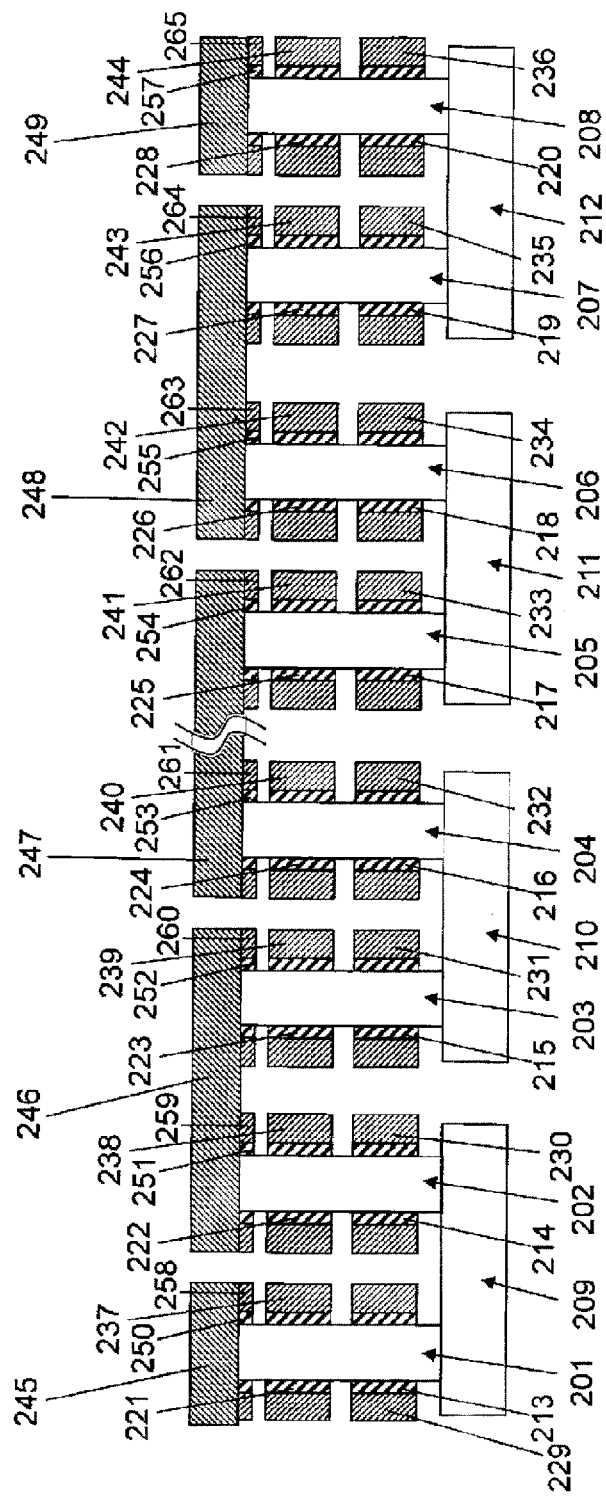
FIG. 1 is a sectional view illustrating a semiconductor device according to an embodiment of the present invention.

FIG. 1 illustrates a structure of a semiconductor device according to an embodiment of the present invention.

A semiconductor device illustrated in FIG. 1 includes a first pillar-shaped semiconductor layer 201, a first selection gate insulating film 221 surrounding the first pillar-shaped semiconductor layer 201, a first selection gate 237 surrounding the first selection gate insulating film 221, a first gate insulating film 250 surrounding an upper portion of the first pillar-shaped semiconductor layer 201, a first contact electrode 258 surrounding the first gate insulating film 250, and a first bit line 245 connected to an upper portion of the first pillar-shaped semiconductor layer 201 and an upper portion of the first contact electrode 258.

A third selection gate insulating film 213 surrounding the first pillar-shaped semiconductor layer 201 and a third selection gate 229 surrounding the third selection gate insulating film 213 are formed below the first selection gate 237.

The gate formed below the first selection gate 237 may be a control gate. Furthermore, a layer including a charge storage layer may be used instead of the third selection gate insulating film 213.

The semiconductor device illustrated in FIG. 1 further includes a second pillar-shaped semiconductor layer 202; a layer 214 including a first charge storage layer and surrounding the second pillar-shaped semiconductor layer 202; a first control gate 230 surrounding the layer 214 including the first charge storage layer; a layer 222 including a second charge storage layer, surrounding the second pillar-shaped semiconductor layer 202, and formed above the first control gate 230; a second control gate 238 surrounding the layer 222 including the second charge storage layer; a second gate insulating film 251 surrounding an upper portion of the second pillar-shaped semiconductor layer 202; a second contact electrode 259 surrounding the second gate insulating film 251; and a first lower internal line 209 that connects a lower portion of the first pillar-shaped semiconductor layer 201 and a lower portion of the second pillar-shaped semiconductor layer 202. An upper portion of the second pillar-shaped semiconductor layer 202 and an upper portion of the second contact electrode 259 are connected to each other.

The layer including a charge storage layer preferably includes a nitride film as the charge storage layer, and may have a laminated structure of oxide film/nitride film/oxide film. A polysilicon may be used for the charge storage layer. The layer including a charge storage layer may have a laminated structure of oxide film/polysilicon/oxide film.

The semiconductor device illustrated in FIG. 1 further includes a third pillar-shaped semiconductor layer 207; a layer 219 including a third charge storage layer and surrounding the third pillar-shaped semiconductor layer 207; a third control gate 235 surrounding the layer 219 including the third charge storage layer; a layer 227 including a fourth charge storage layer, surrounding the third pillar-shaped semiconductor layer 207, and formed above the third control gate 235: a fourth control gate 243 surrounding the layer 227 including the fourth charge storage layer; a third gate insulating film 256 surrounding an upper portion of the third pillar-shaped semiconductor layer 207; and a third contact electrode 264 surrounding the third gate insulating film 256. An upper portion of the third pillar-shaped semiconductor layer 207 and an upper portion of the third contact electrode 264 are connected to each other.

The semiconductor device illustrated in FIG. 1 further includes a fourth pillar-shaped semiconductor layer 208, a second selection gate insulating film 228 surrounding the fourth pillar-shaped semiconductor layer 208, a second selection gate 244 surrounding the second selection gate insulating film 228, a fourth gate insulating film 257 surrounding an upper portion of the fourth pillar-shaped semiconductor layer 208, a fourth contact electrode 265 surrounding the fourth gate insulating film 257, a first source line 249 connected to an upper portion of the fourth pillar-shaped semiconductor layer 208 and the fourth contact electrode 265, and a second lower internal line 212 that connects a lower portion of the third pillar-shaped semiconductor layer 207 and a lower portion of the fourth pillar-shaped semiconductor layer 208.

A fourth selection gate insulating film 220 surrounding the fourth pillar-shaped semiconductor layer 208 and a fourth selection gate 236 surrounding the fourth selection gate insulating film 220 are formed below the second selection gate 244.

The gate formed below the second selection gate 244 may be a control gate. Furthermore, a layer including a charge storage layer may be used instead of the fourth selection gate insulating film 220.

The second control gate 238 may be one of a plurality of second control gates and the fourth control gate 243 may be one of a plurality of fourth control gates, the second control gates and the fourth control gates being arranged in a direction perpendicular to a substrate.

When the transistor is an n-type transistor, the work function of a metal for the first contact electrode 258, the second contact electrode 259, the third contact electrode 264, and the fourth contact electrode 265 is preferably 4.0 eV to 4.2 eV.

When the transistor is a p-type transistor, the work function of a metal for the first contact electrode, the second contact electrode, the third contact electrode, and the fourth contact electrode is preferably 5.0 eV to 5.2 eV.

The semiconductor device illustrated in FIG. 1 further includes a fifth pillar-shaped semiconductor layer 203; a layer 215 including a fifth charge storage layer and surrounding the fifth pillar-shaped semiconductor layer 203; a fifth control gate 231 surrounding the layer 215 including the fifth charge storage layer; a layer 223 including a sixth charge storage layer, surrounding the fifth pillar-shaped semiconductor layer 203, and formed above the fifth control gate 231; a sixth control gate 239 surrounding the layer 223 including the sixth charge storage layer; a fifth gate insulating film 252 surrounding an upper portion of the fifth pillar-shaped semiconductor layer 203; and a fifth contact electrode 260 surrounding the fifth gate insulating film 252. An upper portion of the fifth pillar-shaped semiconductor layer 203 and an upper portion of the fifth contact electrode 260 are connected to each other.

The semiconductor device illustrated in FIG. 1 further includes a sixth pillar-shaped semiconductor layer 204; a layer 216 including a seventh charge storage layer and surrounding the sixth pillar-shaped semiconductor layer 204; a seventh control gate 232 surrounding the layer 216 including the seventh charge storage layer; a layer 224 including an eighth charge storage layer, surrounding the sixth pillar-shaped semiconductor layer 204, and formed above the seventh control gate 232; an eighth control gate 240 surrounding the layer 224 including the eighth charge storage layer; a sixth gate insulating film 253 surrounding an upper portion of the sixth pillar-shaped semiconductor layer 204; a sixth contact electrode 261 surrounding the sixth gate insulating film 253; a third lower internal line 210 that connects a lower portion of the fifth pillar-shaped semiconductor layer 203 and a lower portion of the sixth pillar-shaped semiconductor layer 204; and a first upper internal line 246 that connects the upper portion of the second pillar-shaped upper internal line semiconductor layer 202, the upper portion of the second contact electrode 259, the upper portion of the fifth pillar-shaped semiconductor layer 203, and the upper portion of the fifth contact electrode 260. An upper portion of the sixth pillar-shaped semiconductor layer 204 and an upper portion of the sixth contact electrode 261 are connected to each other. The semiconductor device also includes a third upper internal line 247 that connects the upper portion of the sixth pillar-shaped semiconductor layer 204, the upper portion of the sixth contact electrode 261, and an upper portion of a pillar-shaped semiconductor layer adjacent to the sixth pillar-shaped semiconductor layer 204.

The sixth control gate 239 may be one of a plurality of sixth control gates and the eighth control gate 240 may be one of a plurality of eighth control gates, the sixth control gates and the eighth control gates being arranged in a direction perpendicular to a substrate.

When the transistor is an n-type transistor, the work function of a metal for the fifth contact electrode and the sixth contact electrode is preferably 4.0 eV to 4.2 eV.

When the transistor is a p-type transistor, the work function of a metal for the fifth contact electrode and the sixth contact electrode is preferably 5.0 eV to 5.2 eV.

The semiconductor device illustrated in FIG. 1 further includes a seventh pillar-shaped semiconductor layer 205; a layer 217 including a ninth charge storage layer and surrounding the seventh pillar-shaped semiconductor layer 205; a ninth control gate 233 surrounding the layer 217 including the ninth charge storage layer; a layer 225 including a tenth charge storage layer, surrounding the seventh pillar-shaped semiconductor layer 205, and formed above the ninth control gate 233; a tenth control gate 241 surrounding the layer 225 including the tenth charge storage layer; a seventh gate insulating film 254 surrounding an upper portion of the seventh pillar-shaped semiconductor layer 205, and a seventh contact electrode 262 surrounding the seventh gate insulating film 254. An upper portion of the seventh pillar-shaped semiconductor layer 205 and an upper portion of the seventh contact electrode 262 are connected to each other.

The semiconductor device illustrated in FIG. 1 further includes an eighth pillar-shaped semiconductor layer 206; a layer 218 including an eleventh charge storage layer and surrounding the eighth pillar-shaped semiconductor layer 206; an eleventh control gate 234 surrounding the layer 218 including the eleventh charge storage layer; a layer 226 including a twelfth charge storage layer, surrounding the eighth pillar-shaped semiconductor layer 206, and formed above the eleventh control gate 234; a twelfth control gate 242 surrounding the layer 226 including the twelfth charge storage layer; an eighth gate insulating film 255 surrounding an upper portion of the eighth pillar-shaped semiconductor layer 206; an eighth contact electrode 263 surrounding the eighth gate insulating film 255; a fourth lower internal line 211 that connects a lower portion of the seventh pillar-shaped semiconductor layer 205 and a lower portion of the eighth pillar-shaped semiconductor layer 206; and a second upper internal line 248 that connects the upper portion of the third pillar-shaped semiconductor layer 207, the upper portion of the third contact electrode 264, the upper portion of the eighth pillar-shaped semiconductor layer 206, and the upper portion of the eighth contact electrode 263. An upper portion of the eighth pillar-shaped semiconductor layer 206 and an upper portion of the eighth contact electrode 263 are connected to each other.

The tenth control gate 241 may be one of a plurality of tenth control gates and the twelfth control gate 242 may be one of a plurality of twelfth control gates, the tenth control gates and the twelfth control gates being arranged in a direction perpendicular to a substrate.

When the transistor is an n-type transistor, the work function of a metal for the seventh contact electrode and the eighth contact electrode is preferably 4.0 eV to 4.2 eV.

When the transistor is a p-type transistor, the work function of a metal for the seventh contact electrode and the eighth contact electrode is preferably 5.0 eV to 5.2 eV.

The pillar-shaped semiconductor layer around which a selection gate is formed is the first pillar-shaped semiconductor layer 201 and the fourth pillar-shaped semiconductor layer 208. The pillar-shaped semiconductor layer around which only a control gate is formed is the second pillar-shaped semiconductor layer 202, the third pillar-shaped semiconductor layer 207, the fifth pillar-shaped semiconductor layer 203, the sixth pillar-shaped semiconductor layer 204, the seventh pillar-shaped semiconductor layer 205, and the eighth pillar-shaped semiconductor layer 206.

The pillar-shaped semiconductor layers 202, 203, 204, 205, 206, and 207 (number: m) around which only a control gate is formed are arranged in a line, and the pillar-shaped semiconductor layers 201 and 208 around which a selection gate is formed are disposed at the ends of the line. These pillar-shaped semiconductor layers are connected to each other using the lower internal lines 209, 210, 211, and 212, each of which connects the lower portions of the adjacent pillar-shaped semiconductor layers, and the upper-portion internal lines 246, 247, and 248, each of which connects the upper portions of the adjacent pillar-shaped semiconductor layers, so that the memory cells are connected in series. Therefore, the number of selection gates per pillar-shaped semiconductor layer is 2/m.

When m is 32, the number of selection gates per pillar-shaped semiconductor layer is 2/32. When m is 64, the number of selection gates per pillar-shaped semiconductor layer is 2/64. Thus, the number of circuits for driving a selection gate can be decreased.

Furthermore, since the pillar-shaped semiconductor layers around which only a control gate is formed are used, the number of gates can be decreased by one or two. This can decrease the number of production steps.

FIGS. 2A and 2B illustrate a structure of the semiconductor device. A silicon layer is used as a semiconductor layer. The semiconductor layer may be formed of another material.

The semiconductor device illustrated in FIGS. 2A and 2B includes a first pillar-shaped silicon layer 115, a first selection gate insulating film 133a surrounding the first pillar-shaped silicon layer 115, a first selection gate 134a surrounding the first selection gate insulating film 133a, a first gate insulating film 135a surrounding an upper portion of the first pillar-shaped silicon layer 115, a first contact electrode 141a surrounding the first gate insulating film 135a, and a first bit line 137a connected to an upper portion of the first pillar-shaped silicon layer 115 and the first contact electrode 141a.

A third selection gate insulating film 131a surrounding the first pillar-shaped silicon layer 115 and a third selection gate 132a surrounding the third selection gate insulating film 131a are formed below the first selection gate 134a.

The gate formed below the first selection gate 134a may be a control gate. Furthermore, a layer including a charge storage layer may be used instead of the third selection gate insulating film 131a.

The semiconductor device illustrated in FIGS. 2A and 2B further includes a second pillar-shaped silicon layer 116; a layer 131b including a first charge storage layer and surrounding the second pillar-shaped silicon layer 116; a first control gate 132b surrounding the layer 131b including the first charge storage layer; a layer 133b including a second charge storage layer, surrounding the second pillar-shaped silicon layer 116, and formed above the first control gate 132b; a second control gate 134b surrounding the layer 133b including the second charge storage layer; a second gate insulating film 135b surrounding an upper portion of the second pillar-shaped silicon layer 116; a second contact electrode 141b surrounding the second gate insulating film 135b; and a first diffusion layer 127 serving as a first lower internal line that connects a lower portion of the first pillar-shaped silicon layer 115 and a lower portion of the second pillar-shaped silicon layer 116. An upper portion of the second pillar-shaped silicon layer 116 and an upper portion of the second contact electrode 141b are connected to each other.

The semiconductor device illustrated in FIGS. 2A and 2B further includes a first fin-shaped silicon layer 104 formed below the first pillar-shaped silicon layer 115 and the second pillar-shaped silicon layer 116. The first lower internal line is formed in the first fin-shaped silicon layer 104 as the first diffusion layer 127.

The semiconductor device illustrated in FIGS. 2A and 2B further includes a third pillar-shaped silicon layer 117; a layer 131c including a third charge storage layer and surrounding the third pillar-shaped silicon layer 117; a third control gate 132c surrounding the layer 131c including the third charge storage layer; a layer 133c including a fourth charge storage layer, surrounding the third pillar-shaped silicon layer 117, and formed above the third control gate 132c; a fourth control gate 134c surrounding the layer 133c including the fourth charge storage layer; a third gate insulating film 135c surrounding an upper portion of the third pillar-shaped silicon layer 117; and a third contact electrode 141c surrounding the third gate insulating film 135c. An upper portion of the third pillar-shaped silicon layer 117 and an upper portion of the third contact electrode 141c are connected to each other.

The semiconductor device illustrated in FIGS. 2A and 2B further includes a fourth pillar-shaped silicon layer 118, a second selection gate insulating film 133d surrounding the fourth pillar-shaped silicon layer 118, a second selection gate 134d surrounding the second selection gate insulating film 133d, a fourth gate insulating film 135d surrounding an upper portion of the fourth pillar-shaped silicon layer 118, a fourth contact electrode 136d surrounding the fourth gate insulating film 135d, a first source line 137c connected to an upper portion of the fourth pillar-shaped silicon layer 118 and an upper portion of the fourth contact electrode 136d, and a second diffusion layer 128 serving as a second lower internal line that connects a lower portion of the third pillar-shaped silicon layer 117 and a lower portion of the fourth pillar-shaped silicon layer 118.

A fourth selection gate insulating film 131d surrounding the fourth pillar-shaped silicon layer 118 and a fourth selection gate 132d surrounding the fourth selection gate insulating film 131d are formed below the second selection gate 134d.

The gate formed below the second selection gate 134d may be a control gate. Furthermore, a layer including a charge storage layer may be used instead of the fourth selection gate insulating film 131d.

The semiconductor device illustrated in FIGS. 2A and 2B further includes a second fin-shaped silicon layer 105 formed below the third pillar-shaped silicon layer 117 and the fourth pillar-shaped silicon layer 118. The second lower internal line is formed in the second fin-shaped silicon layer 105 as the second diffusion layer 128.

A first element separation film 106 is formed around each of the first fin-shaped silicon layer 104 and the second fin-shaped silicon layer 105.

Since elements are separated by the first element separation film 106 formed around each of the fin-shaped semiconductor layers, memory strings can be formed.

The semiconductor device illustrated in FIGS. 2A and 2B further includes an upper internal line 137b that connects the upper portion of the second pillar-shaped silicon layer 116, the upper portion of the second contact electrode 141b, the upper portion of the third pillar-shaped silicon layer 117, and the upper portion of the third contact electrode 141c.

The first bit line 137a is connected to a second bit line 145a through a contact 146.

Since the pillar-shaped silicon layers are formed on the fin-shaped silicon layers formed on a substrate, the pillar-shaped silicon layers are formed of a single crystal. This avoids a decrease in the mobility of charges due to grain boundaries and consequently avoids a decrease in the read-out speed due to grain boundaries.

The control gates can be insulated from the pillar-shaped silicon layers and the fin-shaped silicon layers by the layers including a charge storage layer that are formed around and under the control gates.

The selection gates can be insulated from the pillar-shaped silicon layers and the selection gates or control gates by the selection gate insulating films formed around and under the selection gates.

Hereafter, a production process for forming a structure of a semiconductor device according to an embodiment of the present invention will be described with reference to FIG. 3A to FIG. 45B. A silicon substrate is used in this embodiment, but a semiconductor substrate other than the silicon substrate may be used.

As illustrated in FIGS. 3A and 3B, first resists 102 and 103 for forming fin-shaped silicon layers are formed on a silicon substrate 101.

As illustrated in FIGS. 4A and 4B, the silicon substrate 101 is etched to form first and second fin-shaped silicon layers 104 and 105. In this case, the fin-shaped silicon layers are formed using the resists as masks, but a hard mask such as an oxide film or a nitride film may be used.

As illustrated in FIGS. 5A and 5B, the first resists 102 and 103 are removed.

As illustrated in FIGS. 6A and 6B, a first element separation film 106 is deposited around the first and second fin-shaped silicon layers 104 and 105. An oxide film formed by using high-density plasma or by low-pressure chemical vapor deposition (CVD) may be used as the first element separation film.

As illustrated in FIGS. 7A and 7B, the first element separation film 106 is etched back to expose upper portions of the first and second fin-shaped silicon layers 104 and 105.

As illustrated in FIGS. 8A and 8B, second insulating films 107 and 108 are formed around the first and second fin-shaped silicon layers 104 and 105, respectively. The second insulating films 107 and 108 are preferably an oxide film.

As illustrated in FIGS. 9A and 9B, a first polysilicon 109 is deposited on the second insulating films 107 and 108 to perform planarization.

Figure 10A:
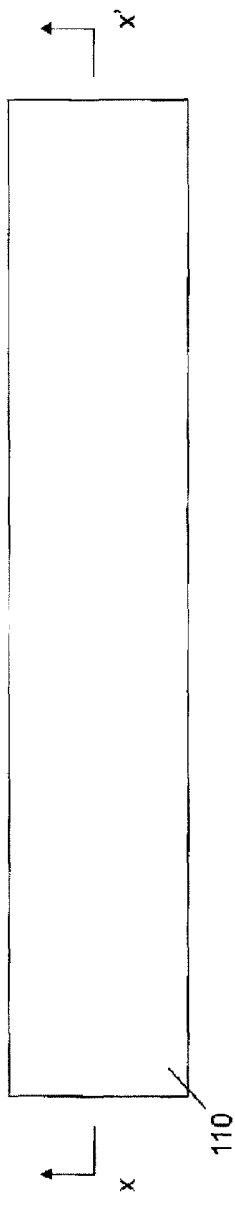
FIG. 10A is a plan view illustrating a method for producing a semiconductor device according to an embodiment of the present invention and FIG. 10B is a sectional view taken along line X-X' in FIG. 10A.
Figure 10B:
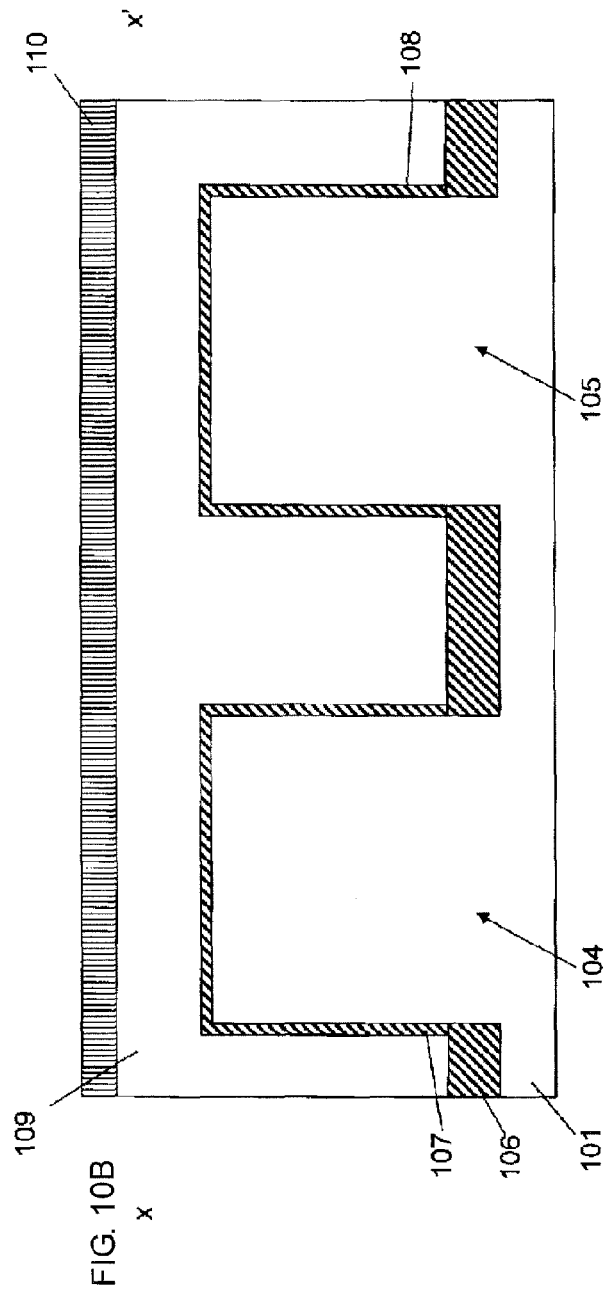

As illustrated in FIGS. 10A and 10B, a third insulating film 110 is formed on the first polysilicon 109. The third insulating film 110 is preferably a nitride film.

As illustrated in FIGS. 11A and 11B, second resists 111, 112, 113, and 114 are formed in a direction perpendicular to a direction in which the first and second fin-shaped silicon layers 104 and 105 extend.

Figures 12A, 12B:
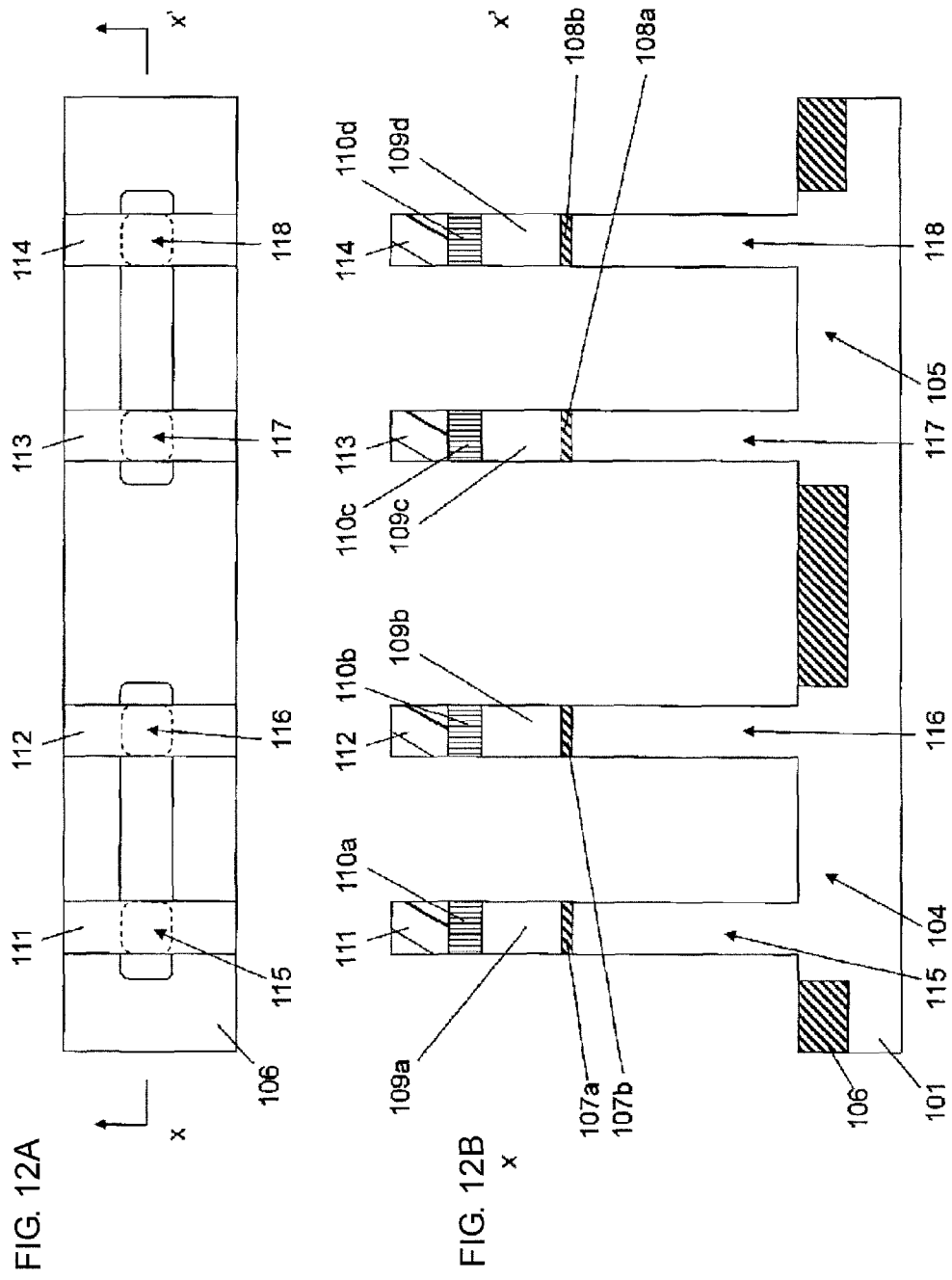
FIG. 12A is a plan view illustrating a method for producing a semiconductor device according to an embodiment of the present invention and FIG. 12B is a sectional view taken along line X-X' in FIG. 12A.

As illustrated in FIGS. 12A and 12B, the third insulating film 110, the first polysilicon 109, the second insulating films 107 and 108, and the first and second fin-shaped silicon layers 104 and 105 are etched to form a first pillar-shaped silicon layer 115, a second pillar-shaped silicon layer 116, a third pillar-shaped silicon layer 117, a fourth pillar-shaped silicon layer 118, and first dummy gates 109a, 109b, 109c, and 109d formed of the first polysilicon. As a result, the third insulating film 110 is divided into third insulating films 110a, 110b, 110c, and 110d. The second insulating films 107 and 108 are divided into second insulating films 107a, 107b, 108a, and 108b. If the second resists 111, 112, 113, and 114 are removed during the etching, the third insulating films 110a, 110b, 110c, and 110d function as a hard mask. If the second resists are not removed during the etching, the third insulating film is not necessarily used.

As illustrated in FIGS. 13A and 13B, the second resists 111, 112, 113, and 114 are removed.

As illustrated in FIGS. 14A and 14B, fourth insulating films 119 and 120 are formed around the first pillar-shaped silicon layer 115, the second pillar-shaped silicon layer 116, the third pillar-shaped silicon layer 117, the fourth pillar-shaped silicon layer 118, and the first dummy gates 109a, 109b, 109c, and 109d.

Figure 15A:
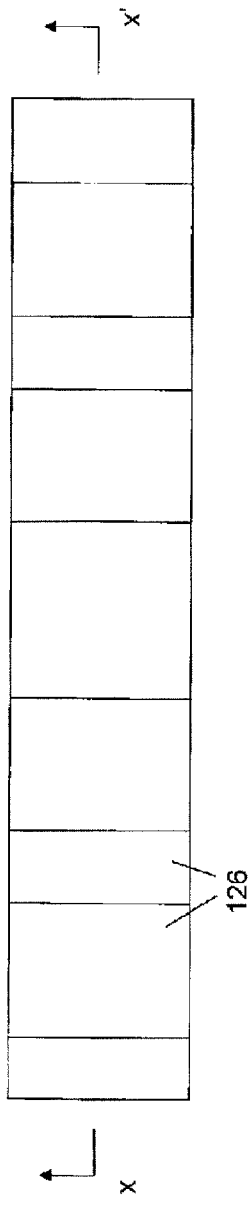
FIG. 15A is a plan view illustrating a method for producing a semiconductor device according to an embodiment of the present invention and FIG. 15B is a sectional view taken along line X-X' in FIG. 15A.
Figure 15B:
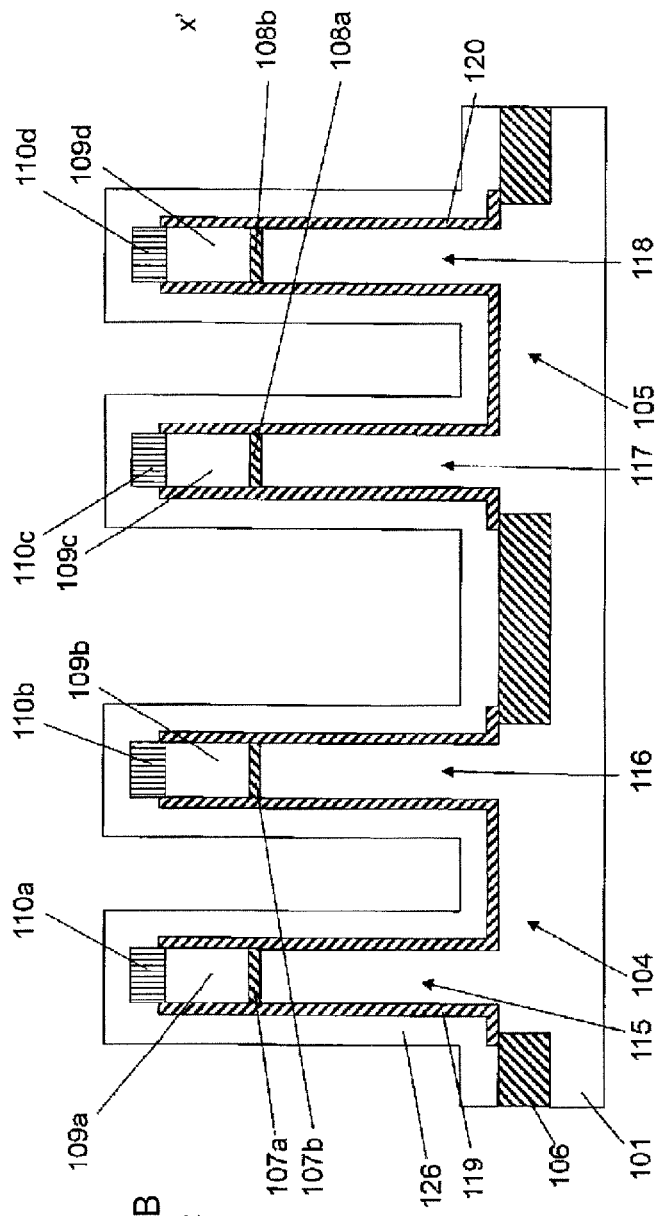

As illustrated in FIGS. 15A and 15B, a second polysilicon 126 is deposited around the fourth insulating films 119 and 120.

As illustrated in FIGS. 16A and 16B, the second polysilicon 126 is etched so as to remain on sidewalls of the first dummy gates 109a, 109b, 109c, and 109d, the first pillar-shaped silicon layer 115, the second pillar-shaped silicon layer 116, the third pillar-shaped silicon layer 117, and the fourth pillar-shaped silicon layer 118. Thus, second dummy gates 126a, 126b, 126c, and 126d are formed. Herein, the fourth insulating films 119 and 120 may be divided into fourth insulating films 119a, 119b, 120a, and 120b. An impurity is introduced to form a first diffusion layer 127 and a second diffusion layer 128 in upper portions of the first and second fin-shaped semiconductor layers 104 and 105, respectively. When the diffusion layer is an n-type diffusion layer, arsenic or phosphorus is preferably introduced. When the diffusion layer is a p-type diffusion layer, boron is preferably introduced. The diffusion layers may be formed after a sidewall formed of a fifth insulating film described below has been formed.

As illustrated in FIGS. 17A and 17B, a fifth insulating film 129 is formed around the second dummy gates 126a, 126b, 126c, and 126d. The fifth insulating film 129 is preferably a nitride film. Subsequently, the fifth insulating film 129 may be etched so as to be left as sidewalls formed of the fifth insulating film, and metal-semiconductor compound layers may be formed on the first diffusion layer 127 and the second diffusion layer 128.

As illustrated in FIGS. 18A and 18B, an interlayer insulating film 130 is deposited. A contact stopper film may be used.

As illustrated in FIGS. 19A and 19B, chemical mechanical polishing is performed to expose upper portions of the first dummy gates 109a, 109b, 109c, and 109d and the second dummy gates 126a, 126b, 126c, and 127d.

As illustrated in FIGS. 20A and 20B, the first dummy gates 109a, 109b, 109c, and 109d and the second dummy gates 126a, 126b, 126c, and 127d are removed.

As illustrated in FIGS. 21A and 21B, the second insulating films 107a, 107b, 108a, and 108b and the fourth insulating films 119a, 119b, 120a, and 120b are removed.

Figure 22A:
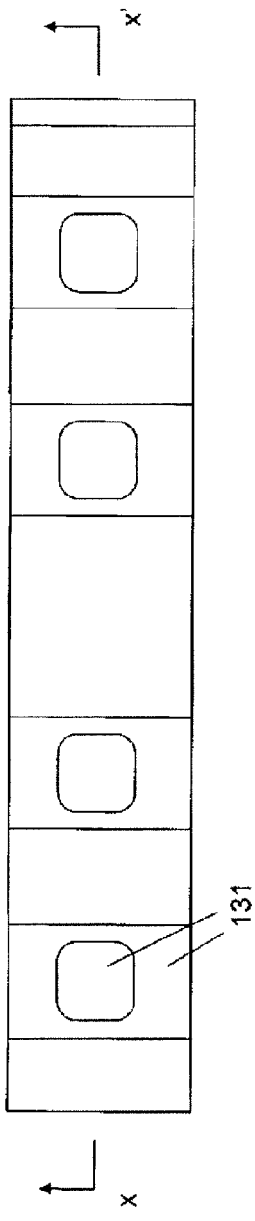
FIG. 22A is a plan view illustrating a method for producing a semiconductor device according to an embodiment of the present invention and FIG. 22B is a sectional view taken along line X-X' in FIG. 22A.
Figure 22B:
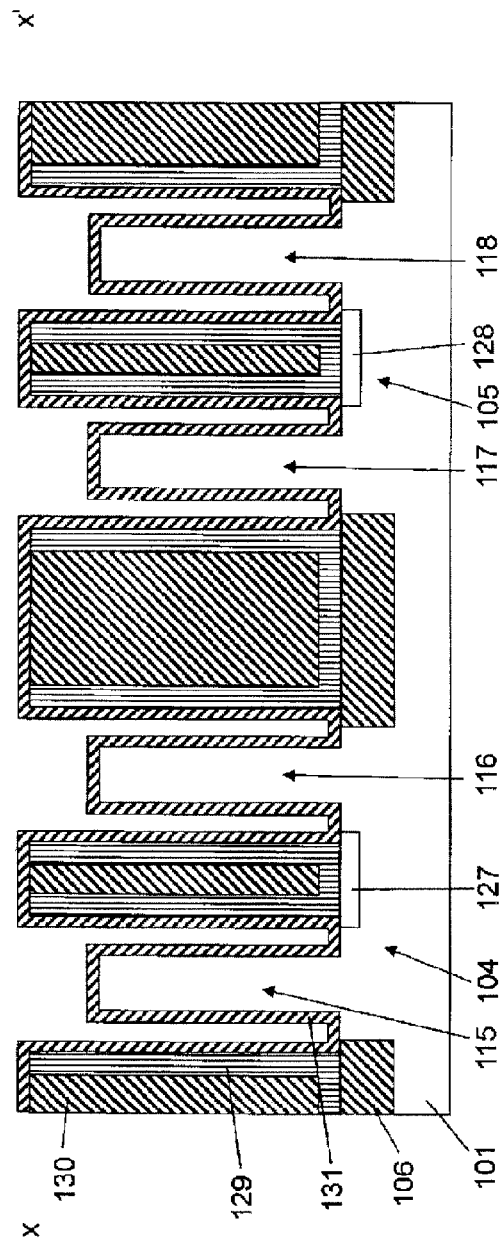

As illustrated in FIGS. 22A and 22B, a layer 131 including a charge storage layer is formed around the first pillar-shaped silicon layer 115, the second pillar-shaped silicon layer 116, the third pillar-shaped silicon layer 117, and the fourth pillar-shaped silicon layer 118 and on the inner surface of the fifth insulating film 129. The layer 131 including a charge storage layer preferably includes a nitride film. Alternatively, the layer 131 may have a laminated structure of oxide film/nitride film/oxide film. In this embodiment of the production method, an insulating film including a nitride film is used as the layer including a charge storage layer. Such an insulating film can also be used as a selection gate insulating film.

Figure 23A:
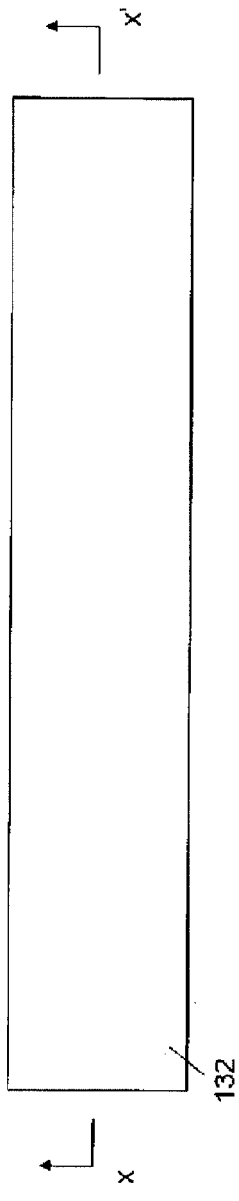
FIG. 23A is a plan view illustrating a method for producing a semiconductor device according to an embodiment of the present invention and FIG. 23B is a sectional view taken along line X-X' in FIG. 23A.
Figure 23B:
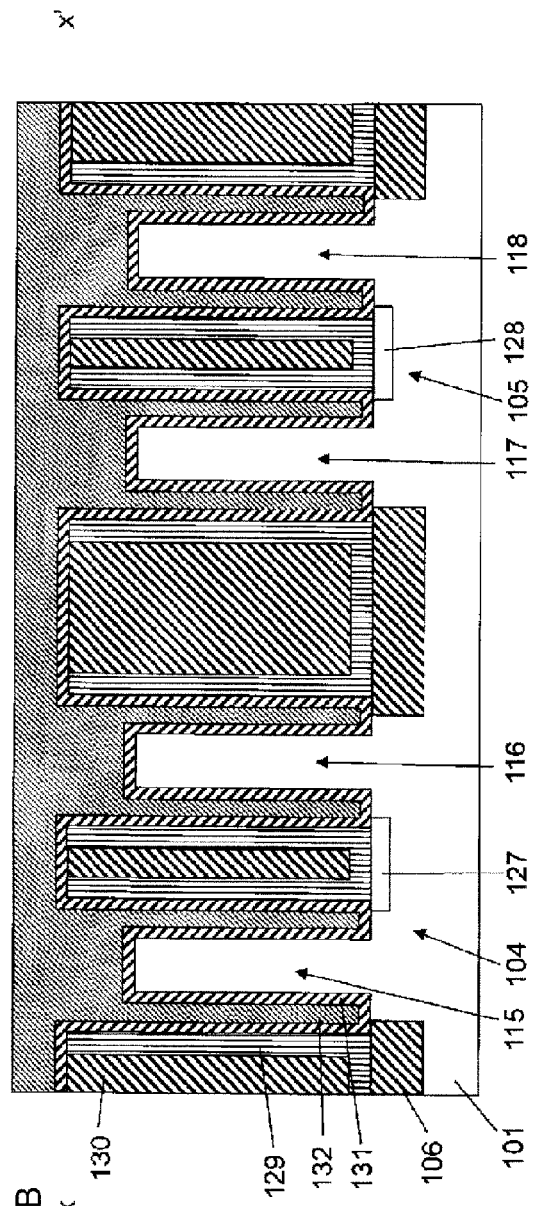

As illustrated in FIGS. 23A and 23B, a gate conductive film 132 is deposited. The gate conductive film 132 is preferably made of a metal.

Figure 24A:
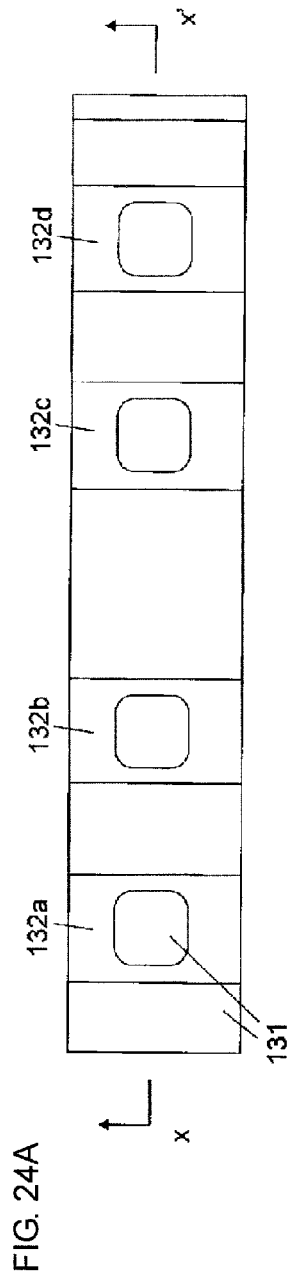
FIG. 24A is a plan view illustrating a method for producing a semiconductor device according to an embodiment of the present invention and FIG. 24B is a sectional view taken along line X-X' in FIG. 24A.
Figure 24B:
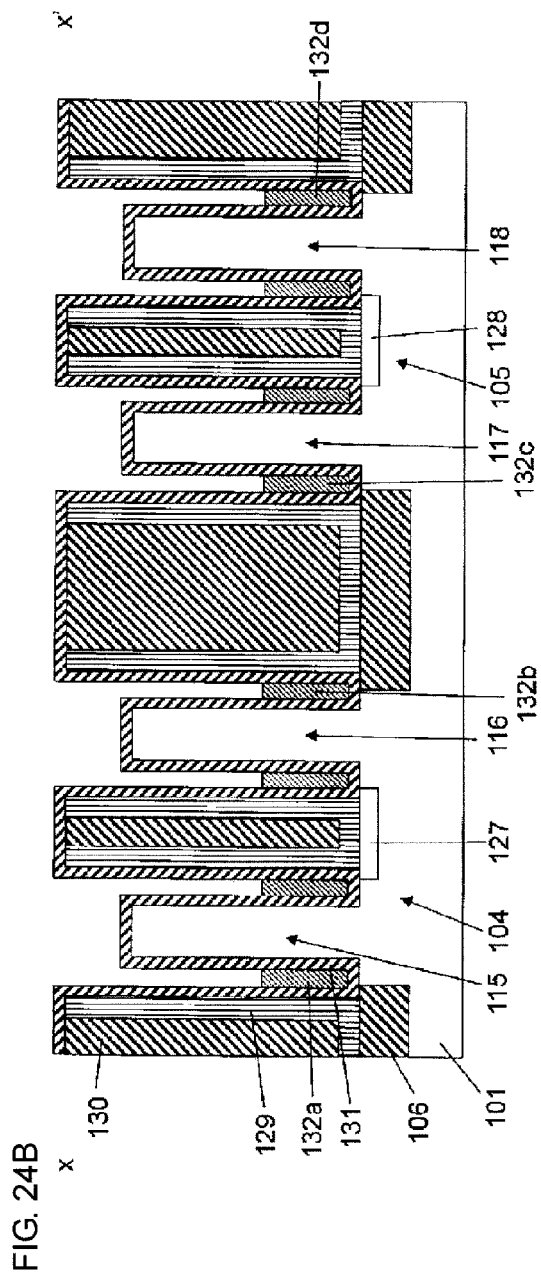

As illustrated in FIGS. 24A and 24B, the gate conductive film 132 is etched back to form a third selection gate 132a around the first pillar-shaped silicon layer 115, a first control gate 132b around the second pillar-shaped silicon layer 116, a third control gate 132c around the third pillar-shaped silicon layer 117, and a fourth selection gate 132d around the fourth pillar-shaped silicon layer 118.

Figure 25A:
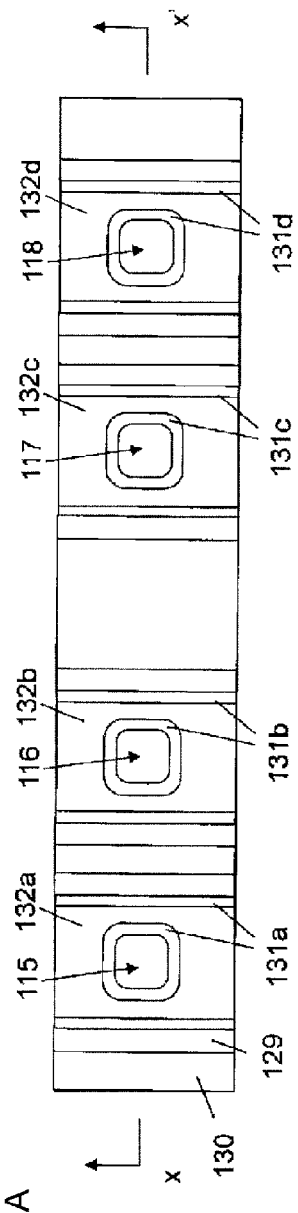
FIG. 25A is a plan view illustrating a method for producing a semiconductor device according to an embodiment of the present invention and FIG. 25B is a sectional view taken along line X-X' in FIG. 25A.
Figure 25B:
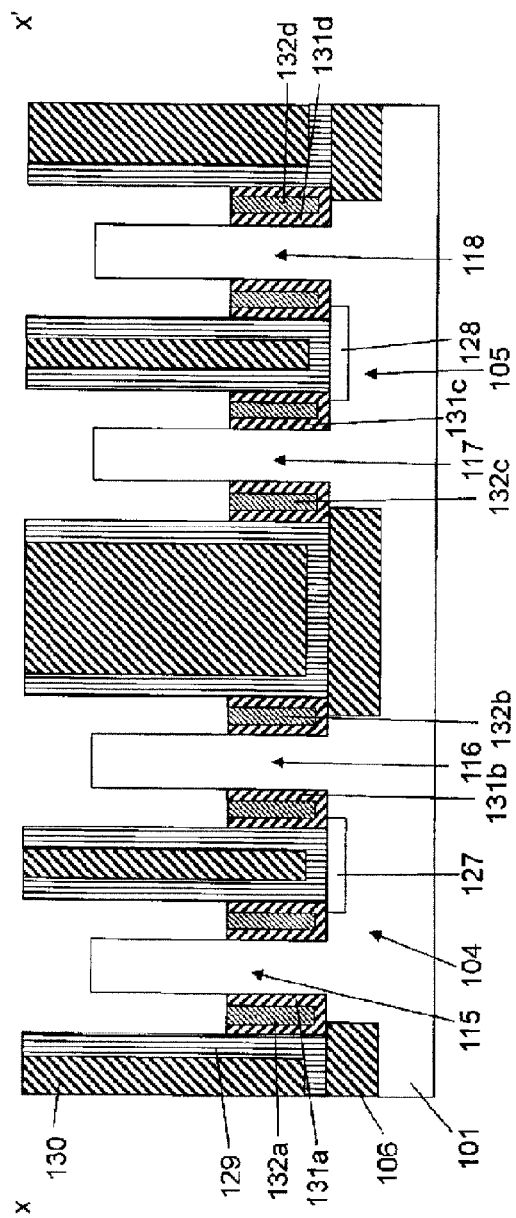

As illustrated in FIGS. 25A and 25B, the exposed layer 131 including a charge storage layer is removed. The layer 131 including a charge storage layer is divided into a third selection gate insulating film 131a, a layer 131b including a first charge storage layer, a layer 131c including a third charge storage layer, and a fourth selection gate insulating film 131d.

Figure 26A:
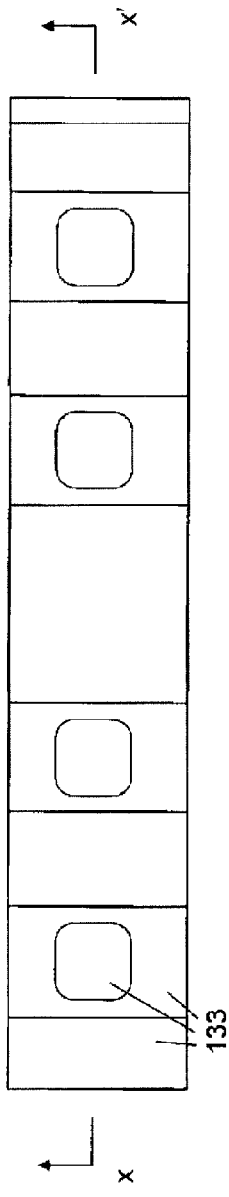
FIG. 26A is a plan view illustrating a method for producing a semiconductor device according to an embodiment of the present invention and FIG. 26B is a sectional view taken along line X-X' in FIG. 26A.
Figure 26B:
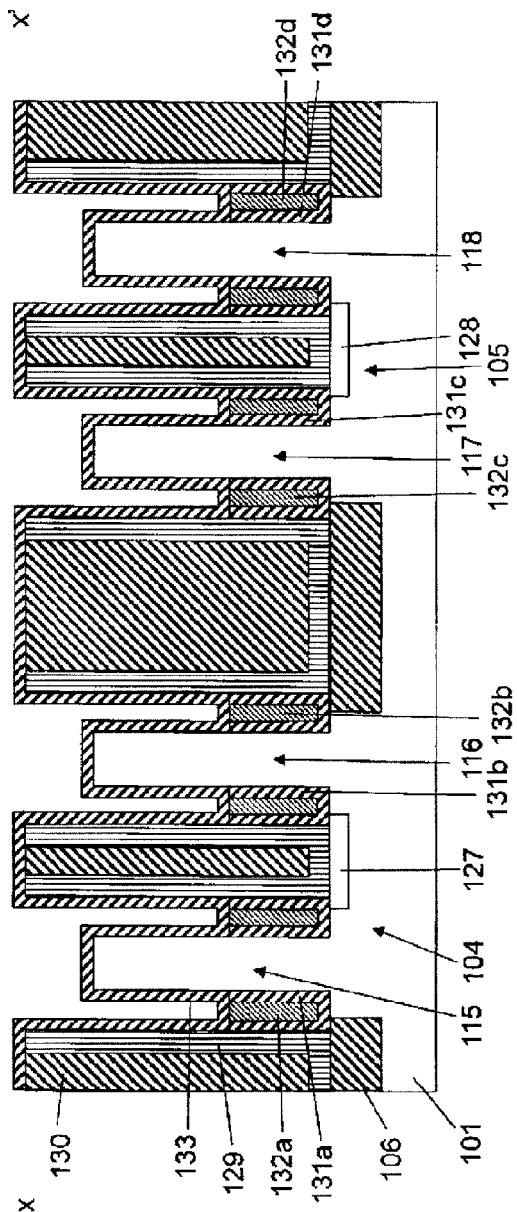

As illustrated in FIGS. 26A and 26B, a layer 133 including a charge storage layer is formed around the first pillar-shaped silicon layer 115, the second pillar-shaped silicon layer 116, the third pillar-shaped silicon layer 117, and the fourth pillar-shaped silicon layer 118 and on the inner surface of the fifth insulating film 129. The layer 133 including a charge storage layer preferably includes a nitride film. Alternatively, the layer 133 may have a laminated structure of oxide film/nitride film/oxide film. In this embodiment of the production method, an insulating film including a nitride film is used as the layer including a charge storage layer. Such an insulating film can also be used as a selection gate insulating film.

As illustrated in FIGS. 27A and 27B, a gate conductive film 134 is deposited. The gate conductive film 134 is preferably made of a metal.

Figure 28A:
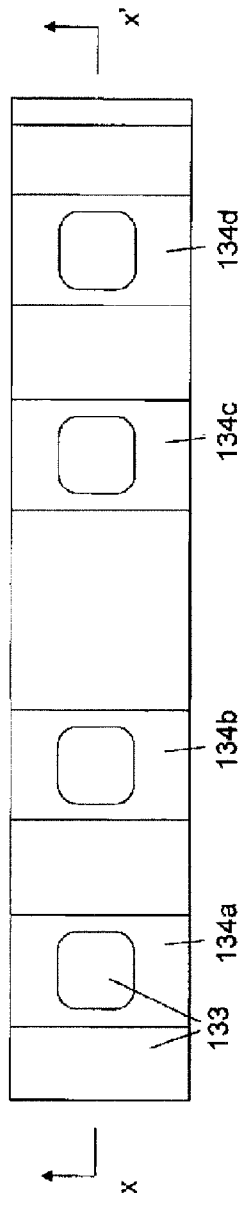
FIG. 28A is a plan view illustrating a method for producing a semiconductor device according to an embodiment of the present invention and FIG. 28B is a sectional view taken along line X-X' in FIG. 28A.
Figure 28B:
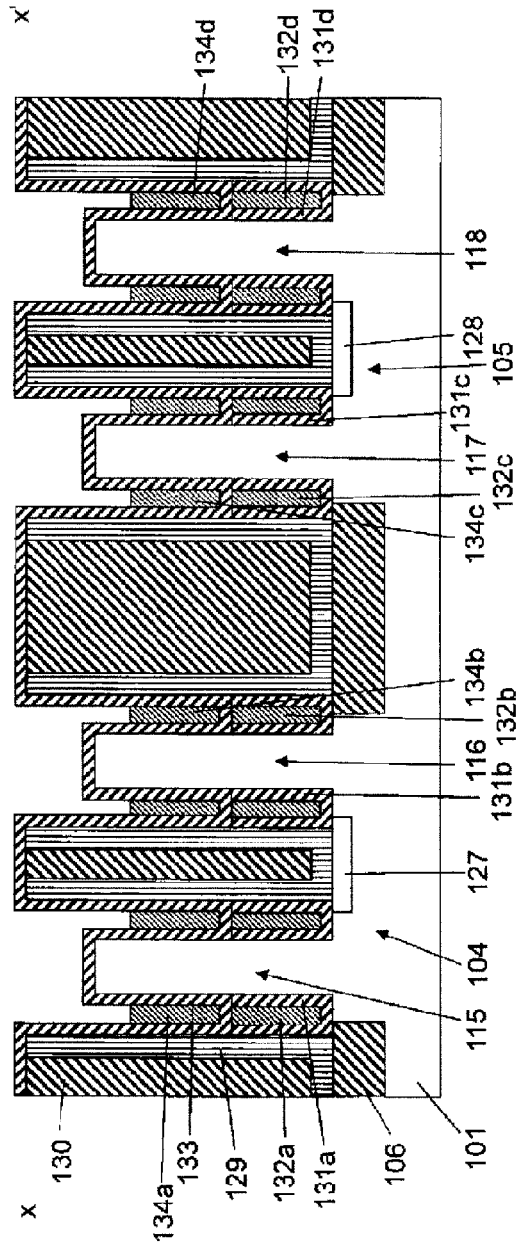

As illustrated in FIGS. 28A and 28B, the gate conductive film 134 is etched back to form a first selection gate 134a around the first pillar-shaped silicon layer 115, a second control gate 134b around the second pillar-shaped silicon layer 116, a fourth control gate 134c around the third pillar-shaped silicon layer 117, and a second selection gate 134d around the fourth pillar-shaped silicon layer 118.

As illustrated in FIGS. 29A and 29B, the layer 133 including a charge storage layer is removed. The layer 133 including a charge storage layer is divided into a first selection gate insulating film 133a, a layer 133b including a second charge storage layer, a layer 133c including a fourth charge storage layer, and a second selection gate insulating film 133d.

As illustrated in FIGS. 30A and 30B, a gate insulating film 135 to be a first gate insulating film, a second gate insulating film, a third gate insulating film, and a fourth gate insulating film is deposited around upper portions of the first pillar-shaped silicon layer 115, the second pillar-shaped silicon layer 116, the third pillar-shaped silicon layer 117, and the fourth pillar-shaped silicon layer 118.

Figure 31A:
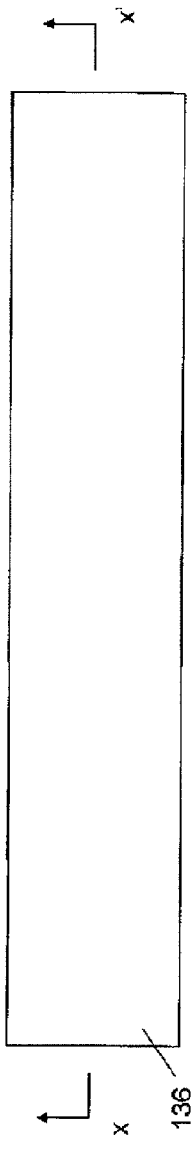
FIG. 31A is a plan view illustrating a method for producing a semiconductor device according to an embodiment of the present invention and FIG. 31B is a sectional view taken along line X-X' in FIG. 31A.
Figure 31B:
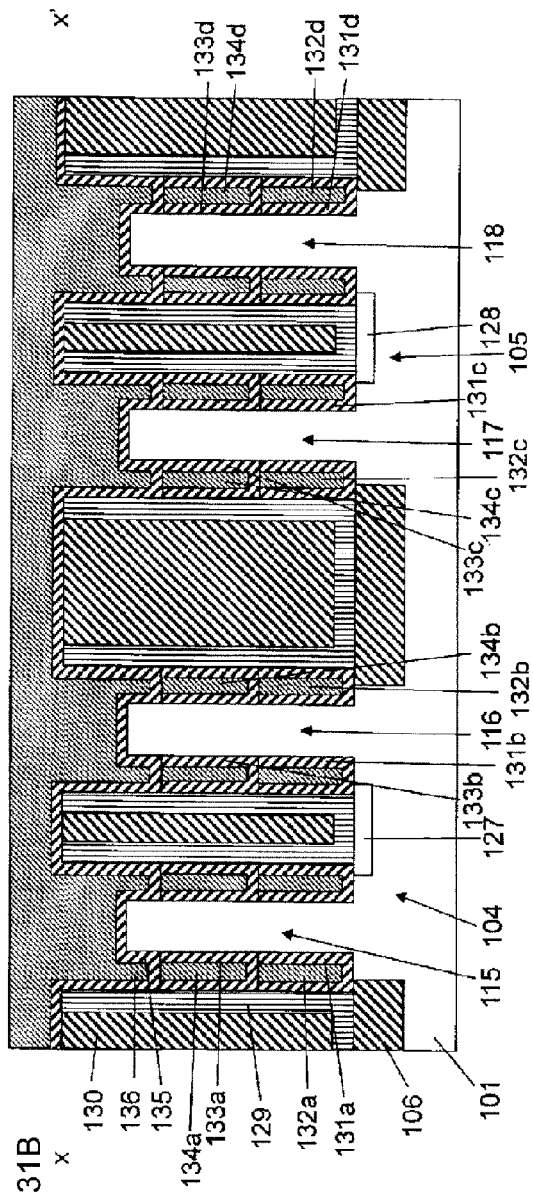

As illustrated in FIGS. 31A and 31B, a metal 136 to be a first contact electrode, a second contact electrode, a third contact electrode, and a fourth contact electrode is deposited.

Figure 32A:
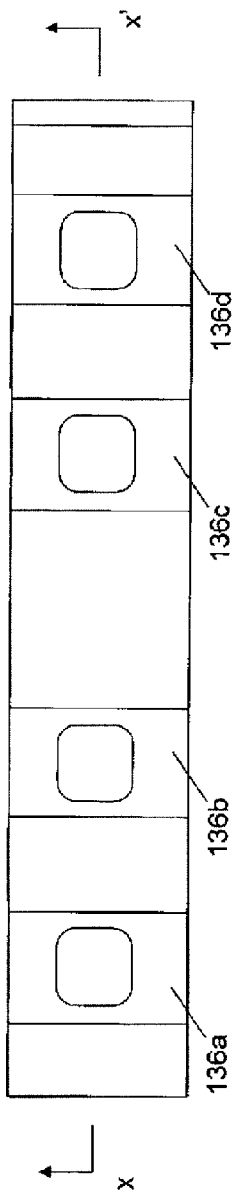
FIG. 32A is a plan view illustrating a method for producing a semiconductor device according to an embodiment of the present invention and FIG. 32B is a sectional view taken along line X-X' in FIG. 32A.
Figure 32B:
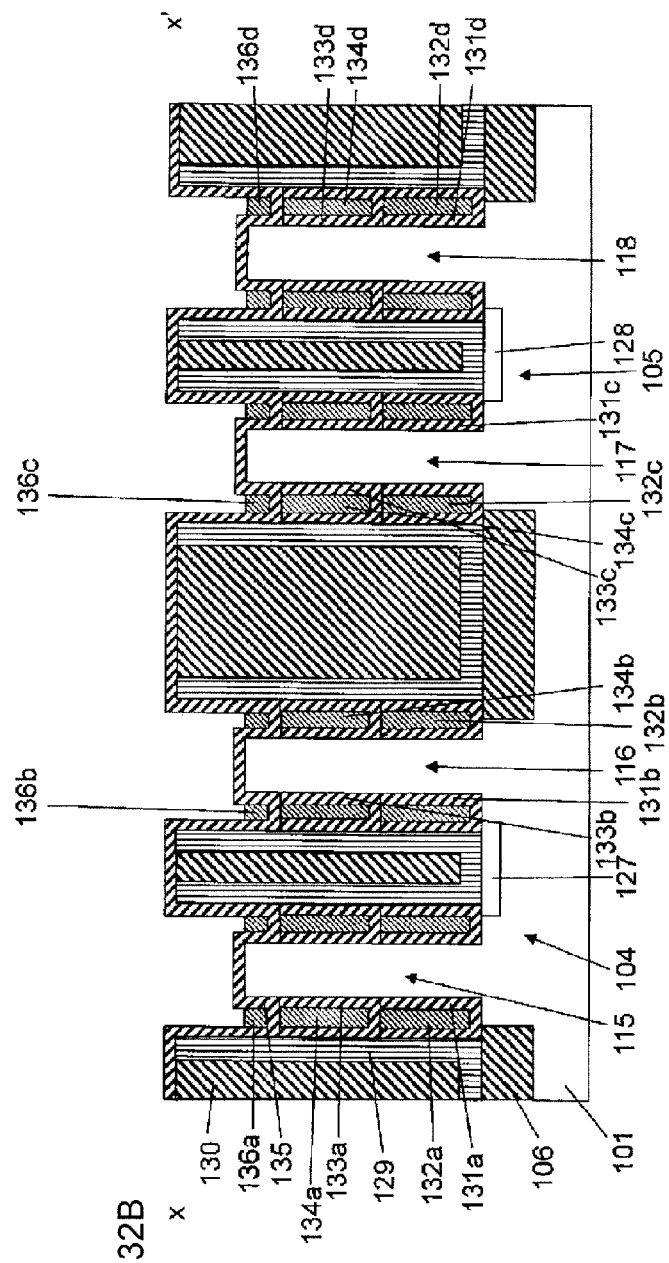

As illustrated in FIGS. 32A and 32B, the metal 136 is etched back to form a first contact electrode line 136a, a second contact electrode line 136b, a third contact electrode line 136c, and a fourth contact electrode line 136d.

Figure 33A:
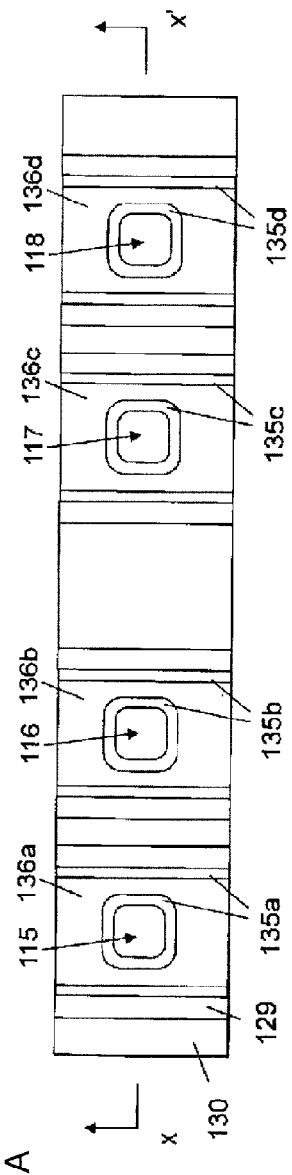
FIG. 33A is a plan view illustrating a method for producing a semiconductor device according to an embodiment of the present invention and FIG. 33B is a sectional view taken along line X-X' in FIG. 33A.
Figure 33B:
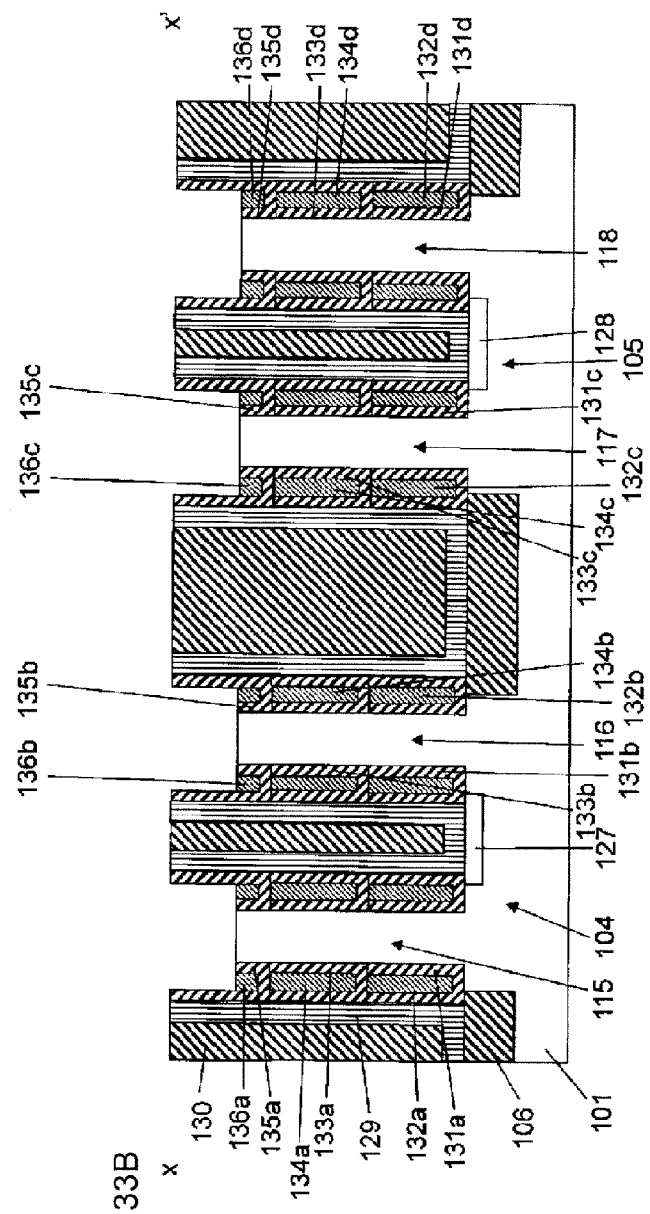

As illustrated in FIGS. 33A and 33B, the exposed gate insulating film 135 is removed. The gate insulating film 135 is divided into a first gate insulating film 135a, a second gate insulating film 135b, a third gate insulating film 135c, and a fourth gate insulating film 135d.

Figure 34A:
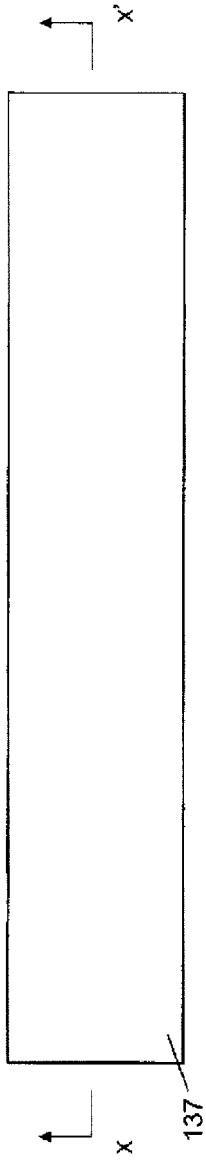
FIG. 34A is a plan view illustrating a method for producing a semiconductor device according to an embodiment of the present invention and FIG. 34B is a sectional view taken along line X-X' in FIG. 34A.
Figure 34B:
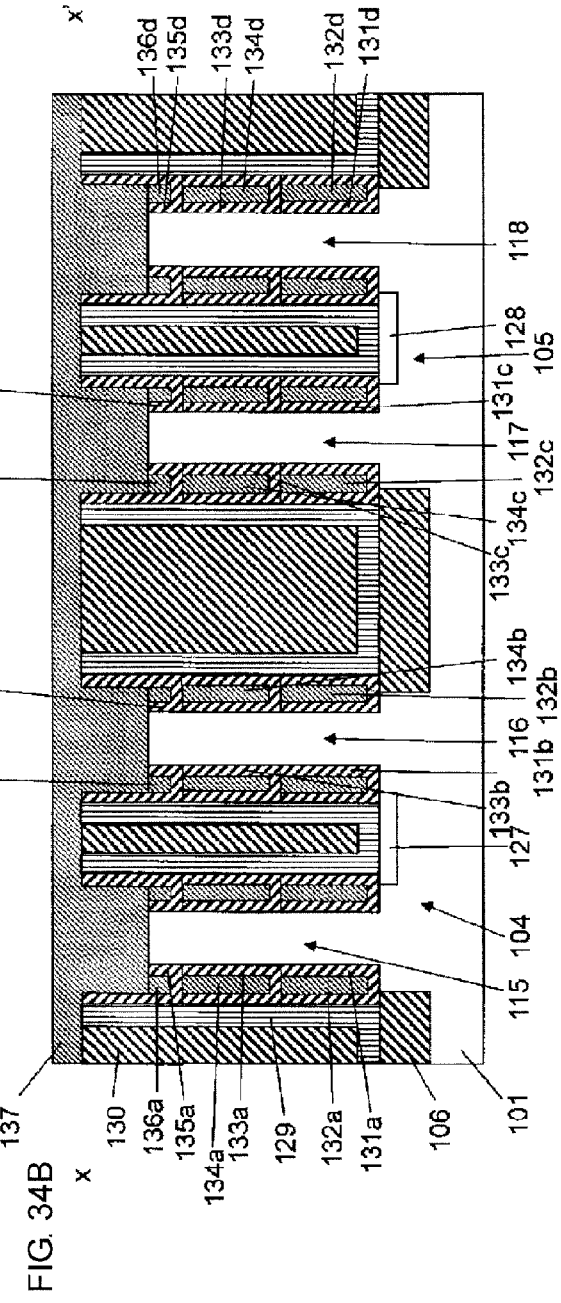

As illustrated in FIGS. 34A and 34B, a metal 137 to be a metal line is deposited.

Figure 35A:
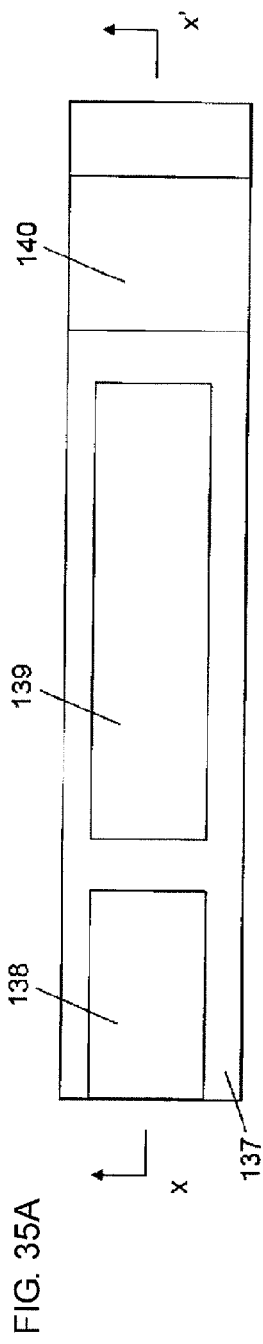
FIG. 35A is a plan view illustrating a method for producing a semiconductor device according to an embodiment of the present invention and FIG. 35B is a sectional view taken along line X-X' in FIG. 35A.
Figure 35B:
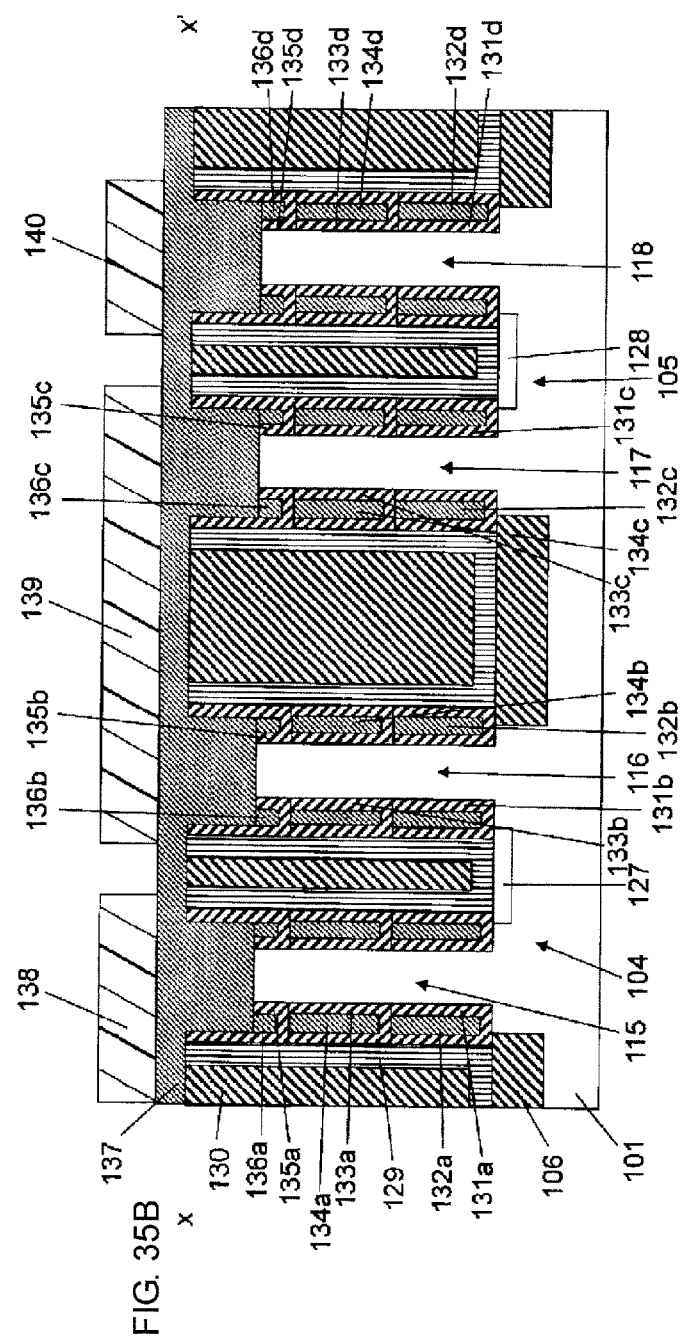

As illustrated in FIGS. 35A and 35B, third resists 138, 139, and 140 for forming a metal line are formed.

As illustrated in FIGS. 36A and 36B, the metal 137, the first contact electrode line 136a, the second contact electrode line 136b, and the third contact electrode line 136c are etched to form a first bit line 137a, an upper internal line 137b, a first source line 137c, a first contact electrode 141a, a second contact electrode 141b, a third contact electrode 141c, and a fourth contact electrode 136d.

Figures 37A, 37B:
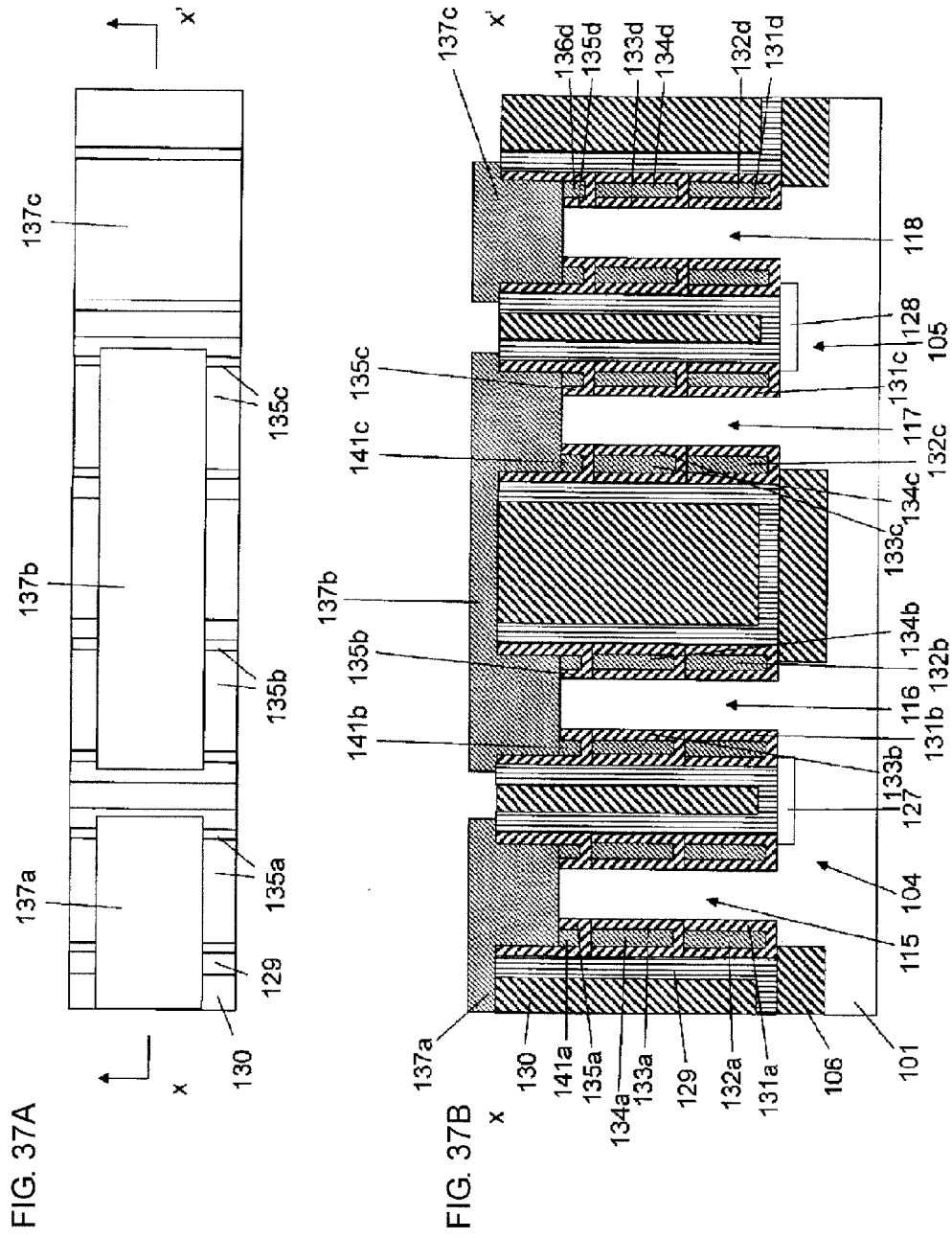
FIG. 37A is a plan view illustrating a method for producing a semiconductor device according to an embodiment of the present invention and FIG. 37B is a sectional view taken along line X-X' in FIG. 37A.

As illustrated in FIGS. 37A and 37B, the third resists 138, 139, and 140 are removed.

As illustrated in FIGS. 38A and 38B, a second interlayer insulating film 142 is deposited.

Figures 39A, 39B:
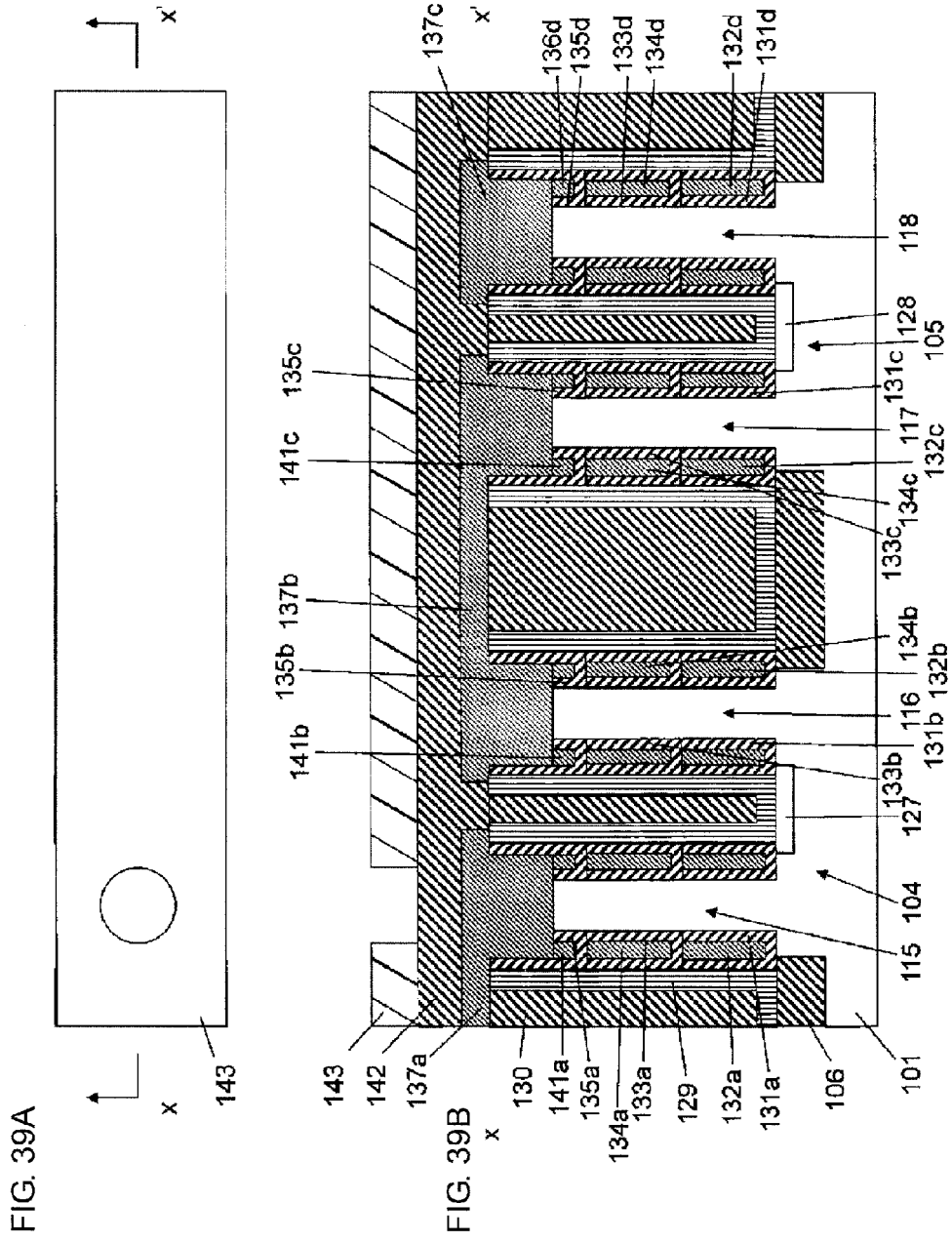
FIG. 39A is a plan view illustrating a method for producing a semiconductor device according to an embodiment of the present invention and FIG. 39B is a sectional view taken along line X-X' in FIG. 39A.

As illustrated in FIGS. 39A and 39B, a fourth resist 143 for forming a contact is formed.

Figure 40A:
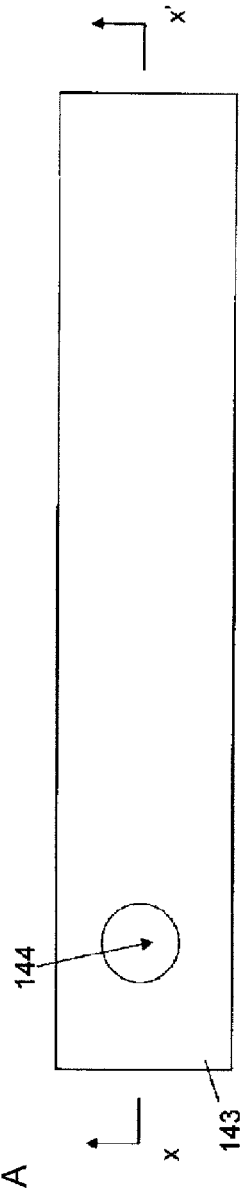
FIG. 40A is a plan view illustrating a method for producing a semiconductor device according to an embodiment of the present invention and FIG. 40B is a sectional view taken along line X-X' in FIG. 40A.
Figure 40B:
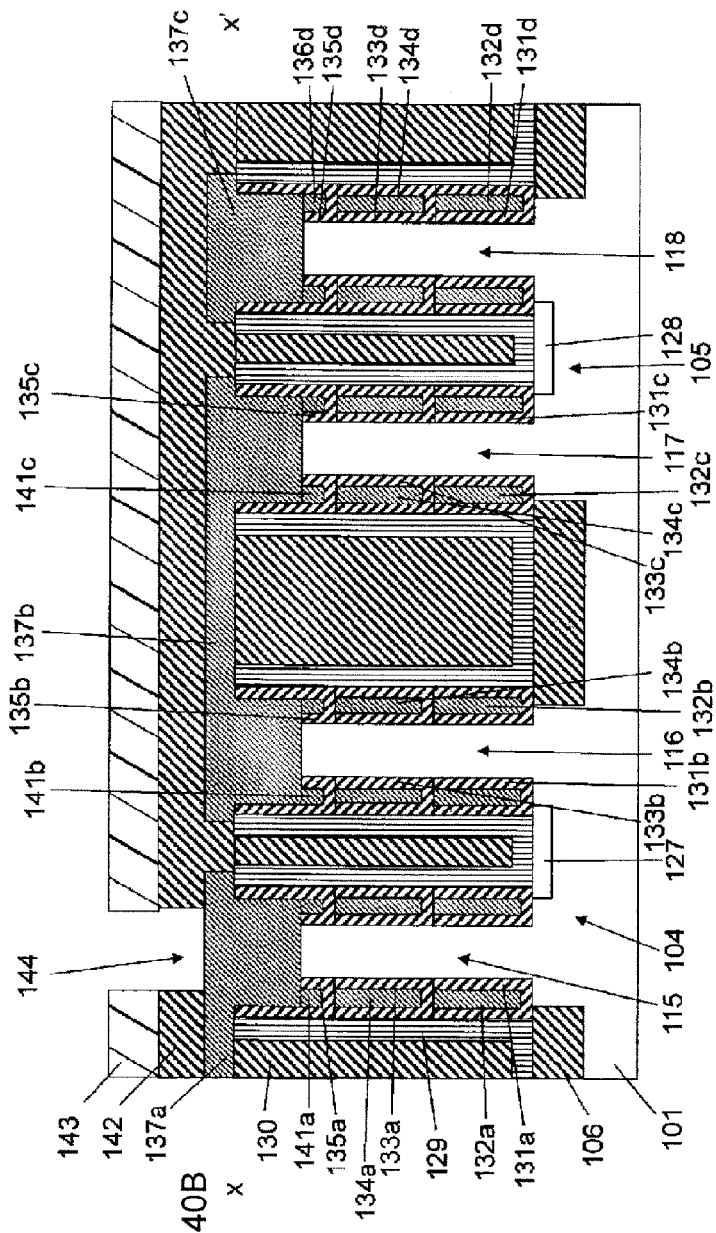

As illustrated in FIGS. 40A and 40B, the second interlayer insulating film 142 is etched to form a contact hole 144.

As illustrated in FIGS. 41A and 41B, the fourth resist 143 is removed.

As illustrated in FIGS. 42A and 42B, a metal 145 is deposited. Herein, the contact hole 144 is filled with the metal, and thus a contact 146 is formed.

As illustrated in FIGS. 43A and 43B, a fifth resist 147 is formed.

As illustrated in FIGS. 44A and 44B, the metal 145 is etched to form a second bit line 145a.

As illustrated in FIGS. 45A and 45B, the fifth resist 147 is removed.

Thus, a process for forming a wiring layer has been described.

Accordingly, the production process for forming a structure of a semiconductor device according to an embodiment of the present invention has been described.

It should be noted that various other embodiments and modifications can be made without departing from the broad spirit and scope of the present invention, and the above-described embodiments are merely for illustrative purpose only and do not limit the scope of the present invention.

For example, in the above-described embodiments, a method for producing a semiconductor device in which the p-type (including the p+-type) and the n-type (including the n+-type) are each changed to the opposite conductivity type and a semiconductor device produced by the method are naturally within the technical scope of the present invention.

What is claimed is:

1. A semiconductor device, comprising:
a first pillar-shaped semiconductor layer;
a first selection gate insulating film surrounding the first pillar-shaped semiconductor layer;
a first selection gate surrounding the first selection gate insulating film;
a first gate insulating film surrounding an upper portion of the first pillar-shaped semiconductor layer;
a first contact electrode surrounding the first gate insulating film;
a first bit line electrically connected to an upper portion of the first pillar-shaped semiconductor layer and an upper portion of the first contact electrode;
a second pillar-shaped semiconductor layer;
a layer including a first charge storage layer and surrounding the second pillar-shaped semiconductor layer;
a first control gate surrounding the layer with the first charge storage layer;
a layer including a second charge storage layer, surrounding the second pillar-shaped semiconductor layer, and formed above the first control gate;
a second control gate surrounding the layer with the second charge storage layer;
a second gate insulating film surrounding an upper portion of the second pillar-shaped semiconductor layer;
a second contact electrode surrounding the second gate insulating film and having an upper portion electrically connected to an upper portion of the second pillar-shaped semiconductor layer;
a first lower internal line that connects a lower portion of the first pillar-shaped semiconductor layer and a lower portion of the second pillar-shaped semiconductor layer and extending in a first direction;
a third pillar-shaped semiconductor layer;
a layer including a third charge storage layer and surrounding the third pillar-shaped semiconductor layer;
a third control gate surrounding the layer with the third charge storage layer;
a layer including a fourth charge storage layer, surrounding the third pillar-shaped semiconductor layer, and formed above the third control gate;
a fourth control gate surrounding the layer with the fourth charge storage layer;
a third gate insulating film surrounding an upper portion of the third pillar-shaped semiconductor layer;
a third contact electrode surrounding the third gate insulating film and having an upper portion electrically connected to an upper portion of the third pillar-shaped semiconductor layer;
a fourth pillar-shaped semiconductor layer;
a second selection gate insulating film surrounding the fourth pillar-shaped semiconductor layer;
a second selection gate surrounding the second selection gate insulating film;
a fourth gate insulating film surrounding an upper portion of the fourth pillar-shaped semiconductor layer;
a fourth contact electrode surrounding the fourth gate insulating film;
a first source line electrically connected to an upper portion of the fourth pillar-shaped semiconductor layer and the fourth contact electrode; and
a second lower internal line that connects a lower portion of the third pillar-shaped semiconductor layer and a lower portion of the fourth pillar-shaped semiconductor layer and extending in the first direction.

2. The semiconductor device according to claim 1, further comprising a substrate, and wherein the second control gate is one of a plurality of second control gates and the fourth control gate is one of a plurality of fourth control gates, the second control gates and the fourth control gates being arranged in a direction perpendicular to said substrate.

3. The semiconductor device according to claim 1, further comprising:
a fifth pillar-shaped semiconductor layer;
a layer including a fifth charge storage layer and surrounding the fifth pillar-shaped semiconductor layer;
a fifth control gate surrounding the layer with the fifth charge storage layer;
a layer including a sixth charge storage layer, surrounding the fifth pillar-shaped semiconductor layer, and formed above the fifth control gate;
a sixth control gate surrounding the layer with the sixth charge storage layer;
a fifth gate insulating film surrounding an upper portion of the fifth pillar-shaped semiconductor layer;

a fifth contact electrode surrounding the fifth gate insulating film and having an upper portion electrically connected to an upper portion of the fifth pillar-shaped semiconductor layer;
a sixth pillar-shaped semiconductor layer;
a layer including a seventh charge storage layer and surrounding the sixth pillar-shaped semiconductor layer;
a seventh control gate surrounding the layer including the seventh charge storage layer;
a layer including an eighth charge storage layer, surrounding the sixth pillar-shaped semiconductor layer, and formed above the seventh control gate;
an eighth control gate surrounding the layer including the eighth charge storage layer;
a sixth gate insulating film surrounding an upper portion of the sixth pillar-shaped semiconductor layer;
a sixth contact electrode surrounding the sixth gate insulating film and having an upper portion electrically connected to an upper portion of the sixth pillar-shaped semiconductor layer;
a third lower internal line that connects a lower portion of the fifth pillar-shaped semiconductor layer and a lower portion of the sixth pillar-shaped semiconductor layer; and
a first upper internal line that electrically connects the upper portion of the second pillar-shaped semiconductor layer, the upper portion of the second contact electrode, the upper portion of the fifth pillar-shaped semiconductor layer, and the upper portion of the fifth contact electrode.

4. The semiconductor device according to claim 3, further comprising a substrate, and wherein the sixth control gate is one of a plurality of sixth control gates and the eighth control gate is one of a plurality of eighth control gates, the sixth control gates and the eighth control gates arranged in a direction perpendicular to said substrate.

5. The semiconductor device according to claim 1, further comprising:
a seventh pillar-shaped semiconductor layer;
a layer including a ninth charge storage layer and surrounding the seventh pillar-shaped semiconductor layer;
a ninth control gate surrounding the layer including the ninth charge storage layer;
a layer including a tenth charge storage layer, surrounding the seventh pillar-shaped semiconductor layer, and formed above the ninth control gate;
a tenth control gate surrounding the layer including the tenth charge storage layer;
a seventh gate insulating film surrounding an upper portion of the seventh pillar-shaped semiconductor layer;
a seventh contact electrode surrounding the seventh gate insulating film and having an upper portion electrically connected to an upper portion of the seventh pillar-shaped semiconductor layer;
an eighth pillar-shaped semiconductor layer;
a layer including an eleventh charge storage layer and surrounding the eighth pillar-shaped semiconductor layer;
an eleventh control gate surrounding the layer including the eleventh charge storage layer;
a layer including a twelfth charge storage layer, surrounding the eighth pillar-shaped semiconductor layer, and formed above the eleventh control gate;
a twelfth control gate surrounding the layer including the twelfth charge storage layer;
an eighth gate insulating film surrounding an upper portion of the eighth pillar-shaped semiconductor layer;
an eighth contact electrode surrounding the eighth gate insulating film and having an upper portion electrically connected to an upper portion of the eighth pillar-shaped semiconductor layer;
a fourth lower internal line that connects a lower portion of the seventh pillar-shaped semiconductor layer and a lower portion of the eighth pillar-shaped semiconductor layer; and
a second upper internal line that electrically connects the upper portion of the third pillar-shaped semiconductor layer, the upper portion of the third contact electrode, the upper portion of the eighth pillar-shaped semiconductor layer, and the upper portion of the eighth contact electrode.

6. The semiconductor device according to claim 5, wherein the tenth control gate is one of a plurality of tenth control gates and the twelfth control gate is one of a plurality of twelfth control gates, the tenth control gates and the twelfth control gates arranged in a direction perpendicular to a substrate.

7. The semiconductor device according to claim 1, further comprising:
a first fin-shaped semiconductor layer below the first pillar-shaped semiconductor layer and the second pillar-shaped semiconductor layer; and
a second fin-shaped semiconductor layer below the third pillar-shaped semiconductor layer and the fourth pillar-shaped semiconductor layer,
wherein the first lower internal line is in the first fin-shaped semiconductor layer, and
the second lower internal line is in the second fin-shaped semiconductor layer.

8. The semiconductor device according to claim 3, further comprising:
a third fin-shaped semiconductor layer below the fifth pillar-shaped semiconductor layer and the sixth pillar-shaped semiconductor layer,
wherein the third lower internal line is in the third fin-shaped semiconductor layer.

9. The semiconductor device according to claim 5, further comprising:
a fourth fin-shaped semiconductor layer below the seventh pillar-shaped semiconductor layer and the eighth pillar-shaped semiconductor layer,
wherein the fourth lower internal line is in the fourth fin-shaped semiconductor layer.

10. The semiconductor device according to claim 7, wherein a first element separation film is around the first fin-shaped semiconductor layer and the second fin-shaped semiconductor layer.

11. The semiconductor device according to claim 1, wherein a third selection gate is below the first selection gate.

12. The semiconductor device according to claim 1, wherein a fourth selection gate is below the second selection gate.

13. The semiconductor device according to claim 1, wherein a thirteenth control gate is below the first selection gate.

14. The semiconductor device according to claim 1, wherein a fourteenth control gate is below the second selection gate.

15. The semiconductor device according to claim 7, wherein the first lower internal line is a first diffusion layer, and the second lower internal line is a second diffusion layer.

16. The semiconductor device according to claim 8, wherein the third lower internal line is a third diffusion layer.

17. The semiconductor device according to claim 9, wherein the fourth lower internal line is a fourth diffusion layer.

18. The semiconductor device according to claim 1, wherein a metal for the first contact electrode, the second contact electrode, the third contact electrode, and the fourth contact electrode has a work function of between 4.0 eV and 4.2 eV.

19. The semiconductor device according to claim 1, wherein a metal for the first contact electrode, the second contact electrode, the third contact electrode, and the fourth contact electrode has a work function of between 5.0 eV and 5.2 eV.

20. The semiconductor device according to claim 3, wherein a metal for the fifth contact electrode and the sixth contact electrode has a work function of between 4.0 eV and 4.2 eV.

21. The semiconductor device according to claim 3, wherein a metal for the fifth contact electrode and the sixth contact electrode has a work function of between 5.0 eV and 5.2 eV.

22. The semiconductor device according to claim 5, wherein a metal for the seventh contact electrode and the eighth contact electrode has a work function of between 4.0 eV and 4.2 eV.

23. The semiconductor device according to claim 5, wherein a metal for the seventh contact electrode and the eighth contact electrode has a work function of between 5.0 eV and 5.2 eV.

24. The semiconductor device according to claim 1, wherein the layer including the first charge storage layer includes a nitride film as a charge storage layer.

* * * * *